(12) United States Patent
Nakamura

(10) Patent No.: US 7,838,982 B2
(45) Date of Patent: Nov. 23, 2010

(54) SEMICONDUCTOR PACKAGE HAVING CONNECTING BUMPS

(75) Inventor: Junichi Nakamura, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/304,868

(22) Filed: Dec. 14, 2005

(65) Prior Publication Data
US 2006/0131730 A1 Jun. 22, 2006

(30) Foreign Application Priority Data
Dec. 16, 2004 (JP) ............... 2004-364983
Jul. 25, 2005 (JP) ............... 2005-214904

(51) Int. Cl.
*H01L 23/12* (2006.01)
*H01L 21/44* (2006.01)

(52) U.S. Cl. ............... 257/700; 257/737; 257/E23.011; 438/613

(58) Field of Classification Search ............ 257/700, 257/758, 737; 361/760
See application file for complete search history.

(56) References Cited

U.S. PATENT DOCUMENTS

| | | | | |
|---|---|---|---|---|
| 5,831,832 A | * | 11/1998 | Gillette et al. | 361/760 |
| 6,041,495 A | * | 3/2000 | Yoon et al. | 29/841 |
| 6,121,682 A | * | 9/2000 | Kim | 257/723 |
| 6,245,490 B1 | * | 6/2001 | Yoon et al. | 430/318 |
| 6,518,664 B2 | * | 2/2003 | Miyamoto | 257/737 |
| 6,740,577 B2 | * | 5/2004 | Jin et al. | 438/612 |
| 6,861,757 B2 | | 3/2005 | Shimoto et al. | |
| 2001/0035570 A1 | * | 11/2001 | Iijima et al. | 257/678 |
| 2002/0030245 A1 | * | 3/2002 | Hanaoka et al. | 257/621 |
| 2002/0100977 A1 | * | 8/2002 | Kimura | 257/738 |
| 2003/0160325 A1 | * | 8/2003 | Yoneda et al. | 257/758 |
| 2004/0197979 A1 | * | 10/2004 | Jeong et al. | 438/202 |
| 2005/0127508 A1 | * | 6/2005 | Lee et al. | 257/737 |

FOREIGN PATENT DOCUMENTS

JP 9-283925 10/1997

* cited by examiner

*Primary Examiner*—Wael M Fahmy
*Assistant Examiner*—Sarah K Salerno
(74) *Attorney, Agent, or Firm*—Locke Lord Bissell & Liddell LLP

(57) ABSTRACT

A semiconductor package and a fabrication method thereof are disclosed, whereby an environmental problem is solved by using external connection terminals or semiconductor element-mounting terminals containing a smaller amount of lead, while at the same time achieving a fine pitch of the terminals. The semiconductor package includes a board (20) including a plurality of insulating resin layers, semiconductor element-mounting terminals (18) formed on the uppermost surface of the board, and external connection terminals (12) formed on the bottom surface thereof. Each external connection terminal (12) is formed as a bump projected downward from the bottom surface of the package, and each bump is filled with the insulating resin (14) while the surface thereof is covered by a metal (16). Wiring (24), (26) including a conductor via (26a) electrically connect the metal of the metal layer 16 and the semiconductor element-mounting terminals (18).

9 Claims, 27 Drawing Sheets

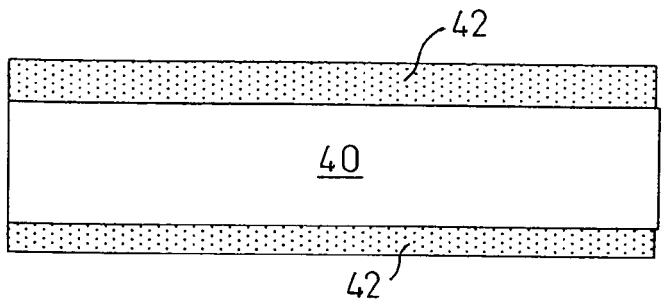
Fig.13(a)
Fig.13(b)
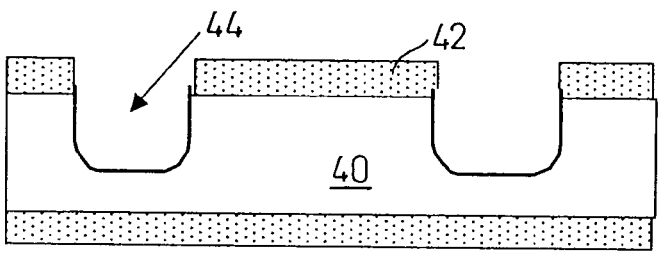
Fig.13(c)
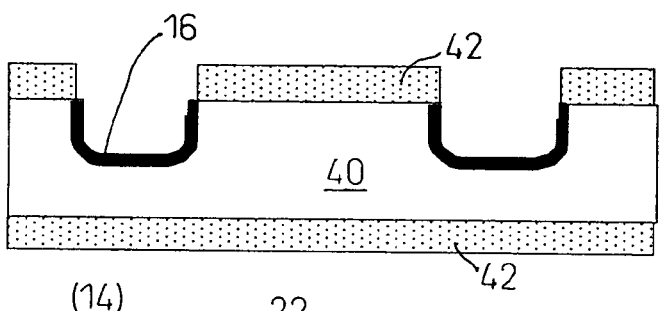
Fig.13(d)
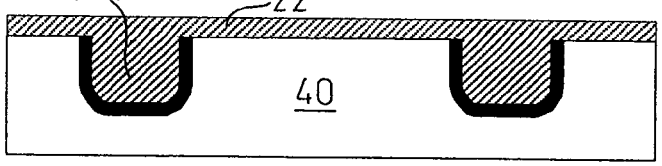
Fig.13(e)
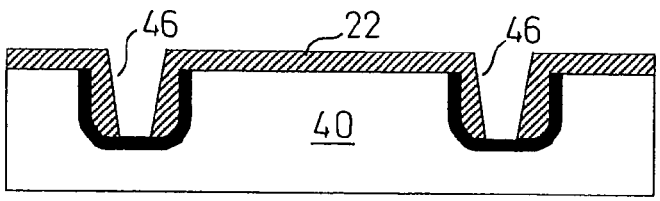
Fig.13(f)
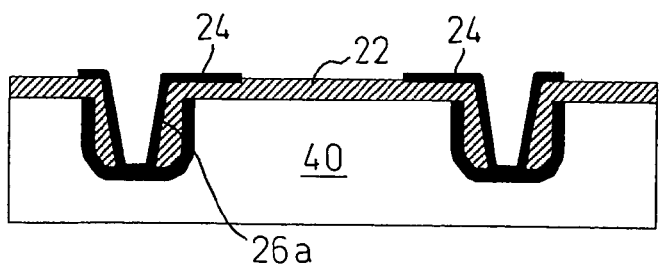

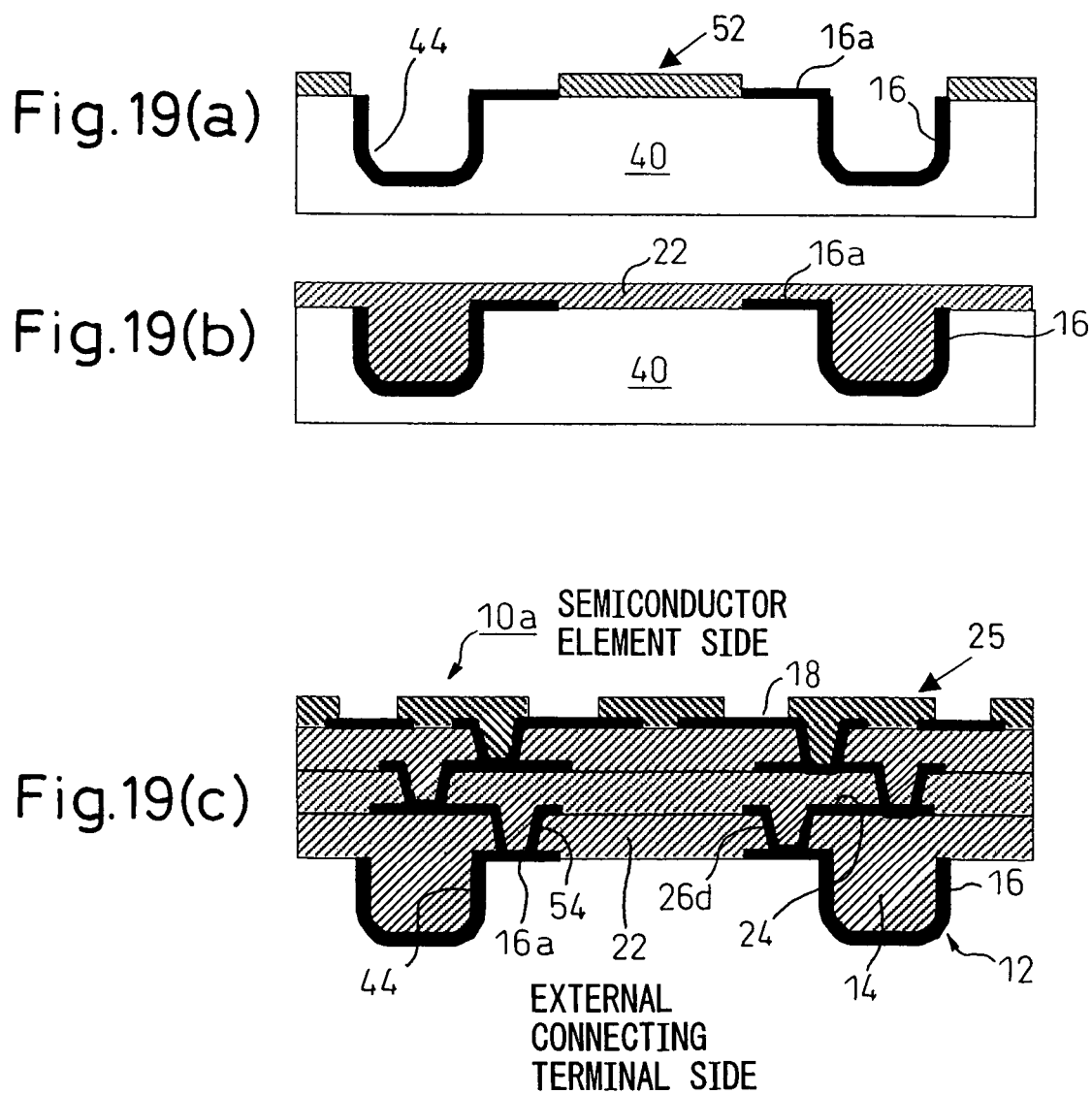

SEMICONDUCTOR PACKAGE HAVING CONNECTING BUMPS

BACKGROUND OF THE INVENTION

1. Field of the Invention

This invention relates to a semiconductor package and a method of fabrication thereof or, in particular, to a semiconductor package and a method of fabrication thereof in which terminals for external connection or terminals for mounting a semiconductor element are formed as bumps protruded from the package surface, each bump being filled with an insulating resin and covered with a metal. The invention further relates to a semiconductor device and a method of fabrication thereof using the semiconductor package.

2. Description of the Related Art

The external connection terminals of the conventional a semiconductor package are formed of a multiplicity of balls for the ball grid array (BGA) package as shown in FIG. 1 and a multiplicity of pins for the pin grid array (PGA) package as shown in FIG. 2.

Specifically, FIG. 1 shows the structure of the conventional BGA package, wherein the upper surface of a package 1 constitutes a semiconductor element-mounting surface, and the lower surface thereof constitutes an external connection terminal side, and wherein a semiconductor element 2 electrically connected to each terminal is mounted on the semiconductor element-mounting surface and the external connection terminals are formed as a multiplicity of balls 3 protruded downward.

FIG. 2 shows the structure of the conventional PGA package in which, as in FIG. 1, the upper surface of the package 1 makes up a semiconductor element-mounting surface, and the lower surface thereof makes up an external connection terminal side on which the semiconductor element 2 electrically connected to each terminal is mounted on the semiconductor element-mounting surface. The external connection terminal side, on the other hand, is configured of a multiplicity of pins 4 protruded downward.

In the case where the solder balls 3 are used as external connection terminals as described above, the terminals are normally formed of a solder containing lead. Also, in the case where the pins 4 are used as the external connection terminals, the portion where the pins 4 are mounted is normally formed of solder containing lead.

From the viewpoint of environment protection, however, demand has recently risen for a connection method in which a semiconductor element is mounted or connected and the external connection terminals coupled with other parts without using a solder containing lead.

As a conventional technique related to this invention, JP-A 9-283925 proposes a BGA semiconductor device including semiconductor elements and mounted in an external circuit, which makes possible a fine pitch of the ball grid array and a reduced package size, while at the same time realizing an improved connection reliability. In the conventional semiconductor device disclosed by this patent publication, depressions for solder bumps of the ball grid array are formed on one surface of a metal plate, and after forming a solder layer and a conductor metal layer by electrolytic plating in the depressions, as many insulating layers and wiring layers as required are stacked on the metal plate thereby to form a multilayer wiring circuit board. After thus mounting the semiconductor element and sealing it with resin, the metal plate is etched off to form the solder bumps.

According to this method, the depressions for solder bumps are formed by etching a metal plate. Therefore, the solder bumps are not substantially varied in shape, and the solder shape remains stable after reflow, thereby contributing to a finer pitch.

JP-A 2004-64082, on the other hand, discloses a configuration in which, in order to realize a fine wiring arrangement with a high density corresponding to an increased number and a smaller pitch of the semiconductor device terminals, wiring is laid on the upper surface of an insulating layer constituting an independent single layer, and an electrode is formed on the lower surface of the insulating layer. The side periphery of the upper end of the electrode is in contact with the insulating layer and the lower end thereof is projected from the lower surface of the insulating layer without contacting the insulating layer. This electrode and the wiring are electrically connected to each other through a via hole formed in the insulating layer, while a support member is arranged on the surface of the insulating layer.

JP-A 2004-64082 also discloses a configuration in which a resist layer having an opening pattern corresponding to the electrode pattern is formed on a substrate, and with the resist layer as a mask, the substrate is etched thereby to form recesses corresponding to the opening pattern of the resist layer on the upper surface of the substrate. After that, a metal is deposited in the recesses and the opening pattern thereby to form an electrode pattern.

According to JP-A 9-283925, the solder bumps are not varied in shape and a fine pitch can be achieved by stabilizing the solder shape after reflow. In view of the fact that the solder of the solder bumps normally contains lead, however, the environmental problem is not solved due to the use of lead in the solder bumps as external connection terminals or semiconductor element connection terminals.

The conventional technique disclosed in JP-A 2004-64082 does not solve the environmental problem posed by the use of lead in the external connection terminals or the semiconductor element connection terminals of a semiconductor package.

SUMMARY OF THE INVENTION

In view of this situation, it is an object of this invention to provide a semiconductor package and a method of fabrication thereof, which solves the environmental problem posed by the use of lead in the external connection terminals for mounting the semiconductor package on other parts or the connection terminals for mounting the semiconductor element on the package on the one hand and which can achieve a fine pitch of the external connection terminals or the semiconductor element connection terminals on the other hand.

Another object of this invention is to provide a semiconductor device and a method of fabrication thereof using the semiconductor package described above.

In order to achieve the objects described above, according to one aspect of the invention, there is provided a semiconductor package comprising: a substrate having a first surface and a second surface opposite to the first surface with a stack of at least an insulating resin layer and a wiring layer, at least a first terminal formed on the first surface of the substrate for mounting a semiconductor element, at least a second terminal formed on the second surface of the substrate for external connection, and a wiring including at least a conductor via including a wiring layer via for electrically connecting the first and second terminals, wherein at least one of the first and second terminals is formed as at least a bump projected from the first or second surface, and the interior of the bump is filled with an insulating resin while the surface of the bump is covered with a metal layer.

In the semiconductor package according to this aspect of the invention, the first terminal for mounting a semiconductor element is formed as a pad, and the second terminal for external connection is formed as a bump projected from the second surface. As a result, the external connection side of the semiconductor package can be formed of the special bump, thereby saving the use of solder lead of the external connection terminal and achieving a fine pitch at the same time.

In this case, the first surface is covered with a solder resist layer, and at least a part of the pad is exposed from the solder resist layer.

Further, the second surface is covered with a solder resist layer, and the bump is projected from the solder resist layer.

In the semiconductor package according to this aspect of the invention with at least a special bump formed on the semiconductor element-mounting side, the first terminal for mounting the semiconductor element is formed as at least a bump projected from the first surface, and the second terminal for external connection is formed as a pad. As a result, the use of the solder lead of the terminal on the semiconductor element-mounting side of the semiconductor package is saved while at the same time achieving a fine pitch.

In this case, the second surface is covered with a solder resist layer, and at least a part of the pad is exposed from the solder resist layer.

Further, the first surface is covered with a solder resist layer, and the bump is projected from the solder resist layer.

In the semiconductor package according to this aspect of the invention, regardless of which side, the external connection side or the semiconductor element-mounting side, is formed as the special bump, the conductor via in the bump is connected to the metal layer on the bump surface through the insulating resin filled in the bump.

As an alternative, the metal layer covering the surface of each bump has an extension pad extending to the first or second surface, and the conductor via is connected to the extension pad through the insulating resin layer making up the substrate.

Also, the metal layer covering the bump surface is made of any selected one of the combinations of metals including, from the surface side, Au/Ni, Au/Ni/Cu, Au/Pd/Ni, Au/Pd/Ni/Pd, Au/Pd/Ni/Pd/Cu and Au/Pd/Ni/Cu.

According to another aspect of this invention, in order to achieve the objects described above, there is provided a semiconductor device including the semiconductor package described above and having the configuration described below.

Specifically, in a semiconductor device according to this invention with the special bump formed on the external connection side of the semiconductor package, a semiconductor element is mounted on the first surface of the semiconductor package in such a manner as to be electrically connected to the first terminal, and a part or the whole of the semiconductor element including a gap between the first surface and the semiconductor element is covered with a seal resin (underfill resin).

In a semiconductor device according to this invention with at least a special bump formed on the semiconductor element-mounting side of a semiconductor package thereof, on the other hand, a semiconductor element is mounted on the first surface of the semiconductor package in such a manner as to be electrically connected to the first terminal formed of the bump, and a part or the whole of the semiconductor element including a gap between the first surface and the semiconductor element is covered with an underfill resin.

In order to achieve the objects described above, according to still another aspect of the invention, there is provided a method of fabricating a semiconductor package, comprising the steps of: forming at least a recess on the surface of a support member; forming a metal layer on the inner surface of the recess; covering an insulating resin on the surface of the support member and the interior of the recess formed with the metal layer; forming, in the insulating resin in the recess, a via hole to which the metal layer is exposed; forming a conductor via in the via hole; forming one or a plurality of insulating resin layers and wiring layers on the insulating resin in such a manner that the wiring layers are electrically connected to the conductor via; forming, on the uppermost insulating resin layer, a terminal connected to the metal layer through the wiring layers; removing the support member and exposing at least a bump filled with an insulating resin and covered with a metal layer at the bottom surface of the package.

In this case, the step of forming at least a recess on the surface of the support member includes the substeps of: forming a resist layer on the surface of the support member; removing the resist layer from the portion formed with the recess and exposing the surface of the support member of the recess-formed portion; and etching the exposed portion of the surface of the support member, while the step of forming the metal layer only on the inner surface of the recess includes the substeps of: plating the inner surface of the recess of the support member formed of a metal and removing the resist layer.

According to yet another aspect of the invention, there is provided a method of fabricating a semiconductor package, comprising the steps of: forming at least a recess on the surface of a support member; forming a metal layer on the inner surface of the recess and an extension over a part of the surface of the support member adjacently to the inner surface; covering an insulating resin on the surface of the support member and the inner surface of the recess formed with the metal layer; forming, on the insulating resin on the extension of the support member, a via hole to which the metal layer on the extension is exposed; forming a conductor via in the via hole; forming one or a plurality of insulating resin layers and wiring layers on the insulating resin in such a manner that the wiring layers are electrically connected to the conductor via; forming, on the uppermost insulating resin layer, a terminal connected to the conductor via through the wiring layers; removing the support member and exposing the bump filled with an insulating resin and covered with a metal layer to the bottom surface of the package.

In this case, the step of forming at least a recess on the surface of the support member includes the substeps of: forming a resist layer on the surface of the support member; removing the resist layer from the recess-formed portion formed and the portion formed with the metal extension over a part of the surface of the support member adjacently to the recess-formed portion and exposing the surface of the support member including the recess-formed portion and the portion formed with the metal extension; and etching the exposed portion of the surface of the support member, while the step of forming the metal layer on the inner surface of the recess and the extension over a part of the surface of the support member adjacently to the inner surface includes the substeps of: plating the inner surface of the recess of the support member formed of a metal and the extension of the support member and removing the resist layer.

According to a further aspect of the invention, there is provided a method of fabricating a semiconductor package, comprising the steps of: forming a solder resist layer on the surface of a support member; forming at least a recess on the surface of the support member from above the solder resist layer; forming a metal layer on the inner surface of the recess of the support member; filling the insulating resin in the recess formed with the metal layer and covering an insulating resin on the surface of the solder resist layer; forming, on the insulating resin in the recess, a via hole to which the metal layer is exposed; forming a conductor via in the via hole; forming one or a plurality of insulating resin layers and wiring layers on the insulating resin in such a manner that the wiring layers are electrically connected to the conductor via; forming, on the uppermost insulating resin layer, at least a terminal connected to the metal layer through the wiring layers; removing the support member and exposing at least a bump filled with an insulating resin and covered with a metal layer to the bottom surface of the package.

In this case, the step of forming at least a recess on the surface of the support member includes the substeps of: forming a solder resist layer on the surface of the support member; removing the resist layer from the portion formed with the recess and exposing the surface of the support member of the recess-formed portion; and etching the exposed portion of the surface of the support member, while the step of forming the metal layer on the inner surface of the recess includes the substep of plating the inner surface of the recess of the support member.

As an alternative, the step of forming at least a recess on the surface of the support member includes the substeps of: forming, on the surface of the support member, a solder resist layer having an opening for exposing the recess-formed portion by the screen printing method or the ink jet printing method; and etching the recess-formed portion of the surface of the support member, while the step of forming a metal layer on the inner surface of the recess includes the substep of plating the inner surface of the recess of the support member.

According to a still further aspect of the invention, there is provided a method of fabricating a semiconductor package, comprising the steps of: forming a solder resist layer on the surface of a support member; forming at least a recess on the surface of the support member from above the solder resist layer; forming a metal layer on the inner surface of the recess of the support member; filling an insulating resin in the recess formed with the metal layer and covering the surface of the solder resist layer with the insulating resin; forming a metal layer only on the inner surface of the recess and an extension over a part of the surface of the solder resist layer adjacently to the inner surface; covering an insulating resin on the surface of the support member and the inner surface of the recess formed with the metal layer; forming, on the insulating resin on the extension of the support member, a via hole to which the metal layer on the extension is exposed; forming a conductor via in the via hole; forming one or a plurality of insulating resin layers and wiring layers on the insulating resin in such a manner that the wiring layers are electrically connected to the conductor via; forming, on the uppermost insulating resin layer, at least a terminal connected to the conductor via through the wiring layers; removing the support member and exposing at least a bump filled with an insulating resin and covered with a metal layer to the bottom surface of the package.

In this case, the step of forming at least a recess on the surface of the support member includes the substeps of: forming a solder resist layer on the surface of the support member; removing the solder resist layer from the recess-formed portion and exposing the surface of the support member of the recess-formed portion; and etching the exposed portion of the surface of the support member, while the step of forming the metal layer only on the inner surface of the recess and the extension over a part of the surface of the solder resist layer adjacently to the inner surface includes the substeps of: plating the inner surface of the recess of the support member; forming a conductor layer on the surface of the solder resist layer; forming a plated resist layer on the surface of the conductor layer; removing the plated resist layer of at least the portion formed with the metal extension and exposing the surface of the conductor layer; plating at least the extension of the support member; and removing the plated resist layer.

As an alternative, the step of forming at least a recess on the surface of the support member includes the substeps of: forming a solder resist layer having an opening for exposing the recess-formed portion by the screen printing method on the surface of the support member; and etching the exposed portion of the surface of the support member, while the step of forming a metal layer only on the inner surface of the recess and the extension over a part of the surface of the solder resist layer adjacently to the inner surface includes the substeps of plating the inner surface of the recess of the support member formed of a metal; forming a conductor layer on the surface of the solder resist layer; forming a plated resist layer on the surface of the conductor layer; removing the plated resist layer from at least the portion formed with the metal extension and exposing the surface of the conductor layer; plating at least the extension of the support member; and removing the plated resist layer.

In the method of fabricating a semiconductor package according to this aspect of the invention, the support member is formed of a metal and, at the support member removing step, the support member is etched off in such a manner that the support member around the bump-formed area is left without being removed and a frame-like reinforcing member is formed around the bump-formed area.

As another alternative, the method of fabricating a semiconductor package according to the invention further comprises the step, before removing the support member after forming at least a terminal connected to the conductor via through the wiring layers on the uppermost insulating resin layer, of mounting a semiconductor element on the uppermost surface in such a manner as to be electrically connected to the terminal and sealing the semiconductor element.

According to another aspect of the invention, there is provided a method of fabricating a semiconductor package, comprising the steps of: forming at least a recess on each of the two surfaces of a support member; forming a metal layer only on the inner surface of the recess on each surface of the support member; covering an insulating resin on the interior of the recess formed with the metal layer on each surface of the support member and each surface of the support member; forming, on the insulating resin in the recess on each surface of the support member, a via hole to which the metal layer is exposed; forming a conductor via in the via hole on each surface of the support member; stacking an insulating resin layer and a wiring layer on the insulating resin on each surface of the support member in such a manner that the wiring layer is electrically connected to the conductor via; forming a terminal connected to the conductor via through the wiring layer on the uppermost insulating resin layer on each surface of the support member; removing the support member and separating the packages formed on the two surfaces of the support member and projecting, from the bottom surface of the package, at least a bump filled with the insulating resin and covered with the metal layer.

In this case, the step of forming at least a recess on each surface of the support member includes the substeps of: forming a resist layer on each surface of the support member; removing the resist layer from the recess-formed portion on each surface of the support member and exposing the surface of the support member at the recess-formed portion on each surface of the support member; and etching the exposed portion on each surface of the support member, while the step of forming the metal layer only on the inner surface of the recess on each surface of the support member includes the substeps of: plating the inner surface of the recess on each surface of the support member formed of a metal and removing the resist layer from each surface of the support member.

According to still another aspect of the invention, there is provided a method of fabricating a semiconductor package, comprising the steps of: forming at least a recess on each of the two surfaces of a support member; forming a metal layer only on the inner surface of the recess on each surface of the support member and an extension over a part of each surface of the support member adjacently to the inner surface; covering an insulating resin on each surface of the support member and the inner surface of the recess formed with the metal layer; forming, on the insulating resin on the extension of the support member of each surface of the support member, a via hole to which the metal layer on the extension is exposed; forming a conductor via in the via hole on each surface of the support member; stacking at least an insulating resin layer and at least a wiring layer on the insulating resin on each surface of the support member in such a manner that the wiring layer is electrically connected to the conductor via; forming at least a terminal connected to the conductor via through the wiring layer on the uppermost insulating resin layer on each surface of the support member; removing the support member, separating the packages formed on the two surfaces of the support member and projecting, from the bottom surface of the package, at least a bump filled with the insulating resin and covered with the metal layer.

In this case, the step of forming at least a recess on each surface of the support member includes the substeps of: forming a first resist layer on each surface of the support member; removing the first resist layer from the recess-formed portion on each surface of the support member and exposing the surface of the support member at the recess-formed portion on each surface of the support member; etching the exposed portion on each surface of the support member; and removing the first resist layer, while the step of forming the metal layer only on the inner surface of the recess on each surface of the support member and the extension over a part of each surface of the support member adjacently to the inner surface includes the substeps of: forming a second resist layer on each surface of the support member; removing the second resist layer from the recess-formed portion on each surface of the support member and the extension over a part of each surface of the support member adjacently to the recess-formed portion and exposing the recess and the extension on each surface of the support member; plating the inner surface of the recess formed of a metal on each surface of the support member and the extension on each surface of the support member; and removing the second resist layer from each surface of the support member.

The support member may be formed of two tabular metal members coupled to each other, and these two tabular members are separated from each other and removed from the package.

The two tabular members may be coupled to each other through a reinforcing plate inserted therebetween, and after being separated from the reinforcing plate, removed from each package.

As an alternative, the support member is formed of a single tabular metal member. The tabular member with a package stacked on each surface thereof is cut into two parts along the surface thereof. After that, the two separated tabular members are removed from the respective packages.

After forming a metal layer on the inner surface of the recess, the surface of the support member except for the area formed with the metal layer may be formed with a solder resist layer. In this case, the solder resist layer can be formed of any one of epoxy acryl resin, epoxy resin and acryl resin.

The insulating resin layer may be formed of epoxy resin or polyimide resin.

In the process of forming the metal layer, the Au/Ni plating, the Au/Ni/Cu plating, the Au/Pd/Ni plating, the Au/Pd/Ni/Pd plating, the Au/Pd/Ni/Pd/Cu plating or the Au/Pd/Ni/Cu plating may be conducted.

Further, according to the invention, in order to achieve the objects described above, there is provided a method of fabricating a semiconductor device having the configuration described below.

Specifically, in the method of fabricating a semiconductor device according to the invention, a semiconductor package is fabricated by a method according to the invention described above in which a terminal connected to a conductor via through a wiring layer is formed on the uppermost insulating resin layer on each surface of the support member, after which a semiconductor element is mounted on the uppermost insulating resin layer in such a manner as to be electrically connected to the terminal before removing the support member.

In this case, after mounting and sealing the semiconductor element, the support member is separated into two parts, which are in turn removed from each semiconductor device.

BRIEF DESCRIPTION OF THE DRAWINGS

FIGS. 13($a$)-13($f$) and 14($a$)-14($b$) show a fabrication process of the semiconductor packages according to the first embodiment;

FIGS. 19($a$)-19($c$) show a fabrication process of the semiconductor packages according to the fifth embodiment;

DESCRIPTION OF THE PREFERRED EMBODIMENT

Embodiments of the invention are described in detail below with reference to the accompanying drawings.

Figure 1:
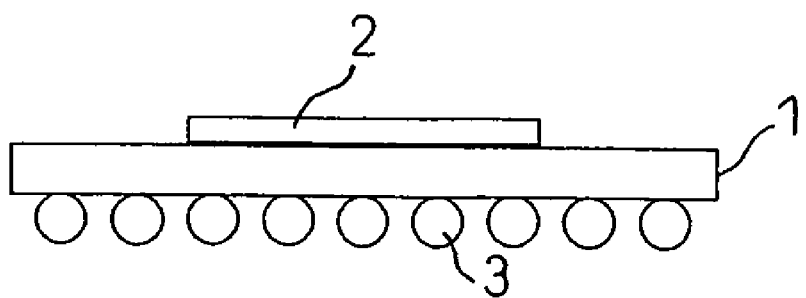
FIG. 1 is a side view of a ball grid array (BGA) package known in the prior art.
Figure 2:
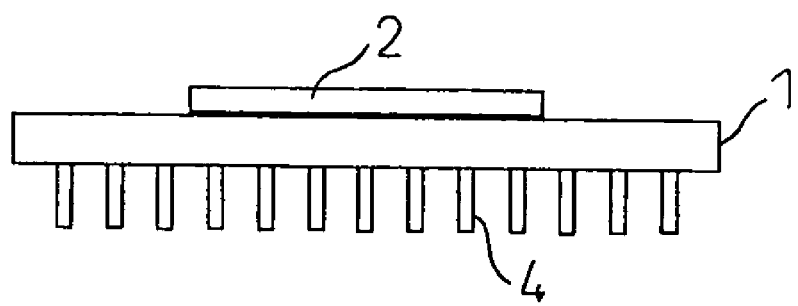
FIG. 2 is a side view of a pin grid array (PGA) package known in the prior art.
Figure 3A:
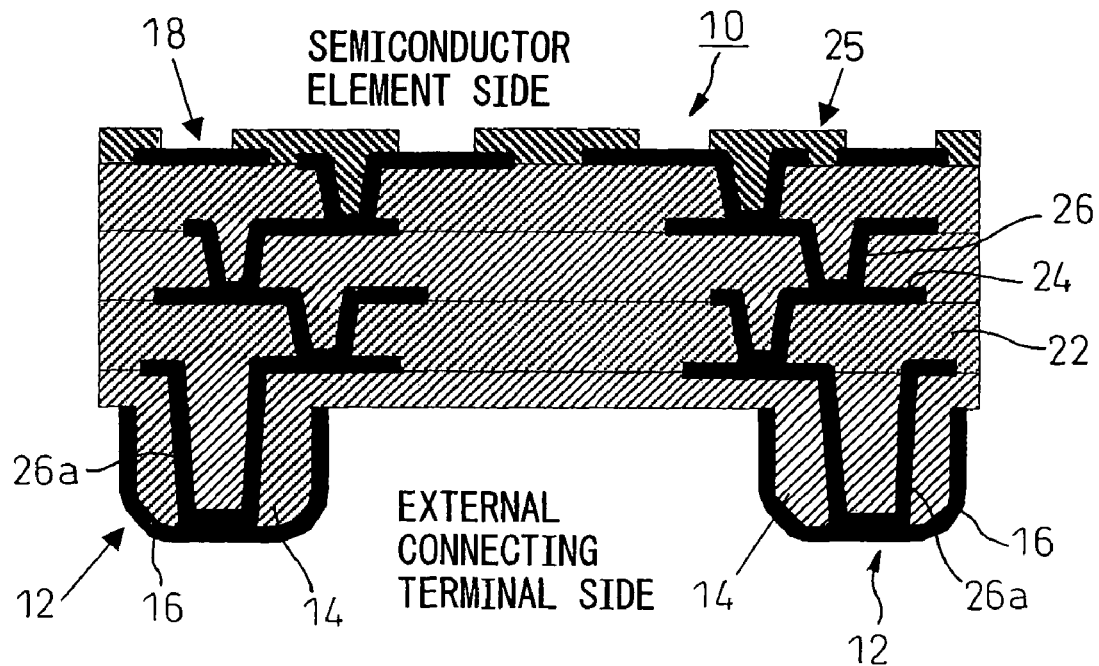
FIG. 3($a$) is a cross-sectional view of a semiconductor package of a first embodiment of this invention and FIG. 3($b$) is a partial cross-sectional view of a modification thereof.

FIG. 3a is a sectional view showing a semiconductor package according to a first embodiment of the invention. In the semiconductor package 10 according to the first embodiment, each terminal 12 formed on the lower surface thereof for external connection is formed as a bump filled with an insulating resin 14 and covered with a metal layer 16, which bump 12 is projected downward from the lower surface of the package 10.

The semiconductor package 10 is formed of a multilayer wiring substrate, and each layer includes an insulating resin layer 22 and a wiring layer 24. In other words, the multilayer wiring substrate includes the insulating resin layer 22 and the wiring layer 24 stacked alternately. The wiring layers 24 in the stack are electrically connected to each other by a via 26 through the insulating resin layer 22.

A multiplicity of external connection bumps 12 are projected downward from the bottom layer of the semiconductor package 10. The external connection bumps 12, as is well known, are used to mount the semiconductor package 10 or a semiconductor device having this semiconductor package 10 on another part such as a motherboard or a printed board while establishing electrical connection. The multiplicity of external connection bumps 12 are arranged in a grid or other desired pattern.

The external connection bumps 12 are filled with the insulating resin 14 of the same material as the insulating resin layer 22, and the surface thereof is covered with a metal layer 16 of gold, nickel or the like. More specifically, the metal layer 16 covering the surface of the bumps 12 can be any of the combinations including, from the outer side, Au/Ni, Au/Ni/Cu, Au/Pd/Ni, Au/Pd/Ni/Pd, Au/Pd/Ni/Pd/Cu and Au/Pd/Ni/Cu.

Figure 3B:
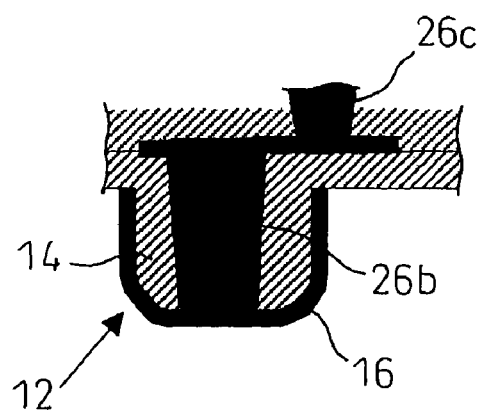

A conductor via 26a having the lower end thereof in contact with the metal layer 16 is passed through each bump 12 filled with the insulating resin 14, while the upper end of the conductor via 26a is connected with a first wiring layer 24. The conductor via 26a, as described later, may be formed by means such as a laser drill in such a manner that the insulating resin 14 is bored until the metal layer 16 is exposed, a metal layer is formed on the bottom surface and along the periphery of the wall of the hole thereby to produce a conductor via 26a filled with the insulating resin 14 while the periphery and the top of the truncated cone as shown in FIG. 3a. Alternatively, as shown in FIG. 3b, a conductor via 26b substantially in the shape of a truncated cone may be filled with a metal in the entire hole opened by the laser drill or the like in the insulating resin 14. Also, as for the conductor via by which the wiring layers 24 of the layers of the multilayer wiring board are connected to each other, like the conductor via 26b, may be configured as a conductor via 26c substantially in the shape of a truncated cone having the whole interior of the hole filled with the metal.

The upper surface of the uppermost layer of the semiconductor package 10 is covered with a solder resist 25, a multiplicity of connection terminals 18 connected to the electrode terminals of the semiconductor element are exposed from the solder resist 25. The semiconductor element connection terminals 18 which are arranged in a multiplicity of numbers in a grid or the like in accordance with the electrode arrangement of the semiconductor element to mounted and covered by the plating of nickel-gold or the like.

As described above, the wiring layers 24 for the respective layers are electrically connected to each other by the layer connecting via 26. The metal layer 16 of the external connection bump 12, therefore, is electrically connected to the semiconductor element connection terminal (pad) 18 through the conductor via 26a, the wiring layer 24 and the layer connection via 26.

Figure 4:
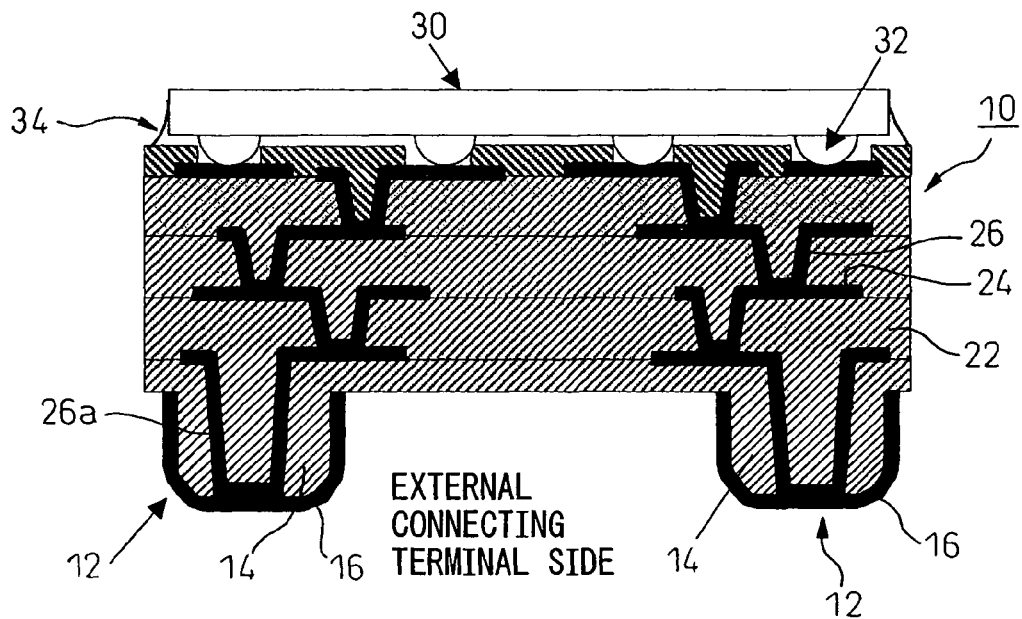
FIG. 4 is a cross-sectional view of a semiconductor device using a package according to the first embodiment.

FIG. 4 is a sectional view of a semiconductor device using a semiconductor package according to the first embodiment shown in FIG. 3a. As described above, the semiconductor element connection terminal 18 is exposed from the solder resist 25 to the upper surface of the uppermost layer of the semiconductor package 10. The semiconductor element 30 having bump-like electrode terminals 32, for example, is mounted on the semiconductor package in such a manner that the electrode terminals 32 are electrically connected to the semiconductor element connection terminal 18. Further, the seal resin 34 (underfill resin) is filled in the gap between the upper surface of the semiconductor package and the semiconductor element 30. In this way, a semiconductor device is completed in which a part or the whole of the semiconductor element 30 is covered by the underfill resin. The semiconductor element 30 may be mounted on the semiconductor package by being connected to the semiconductor element connection terminal 18 by wire bonding (not shown).

Figure 5:
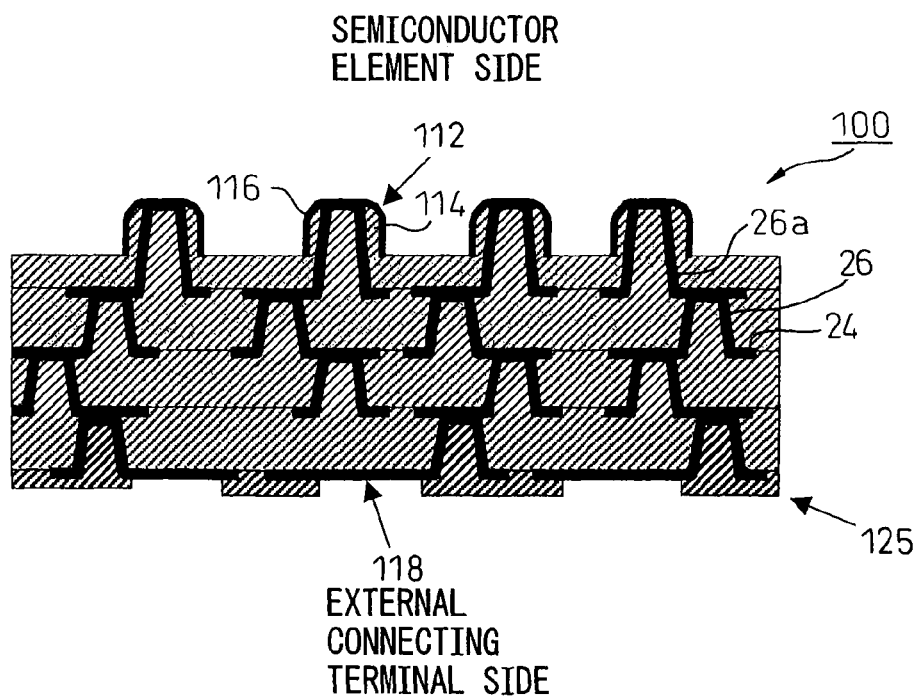
FIG. 5 is a cross-sectional view of a semiconductor package according to a second embodiment of this invention.
Figure 6:
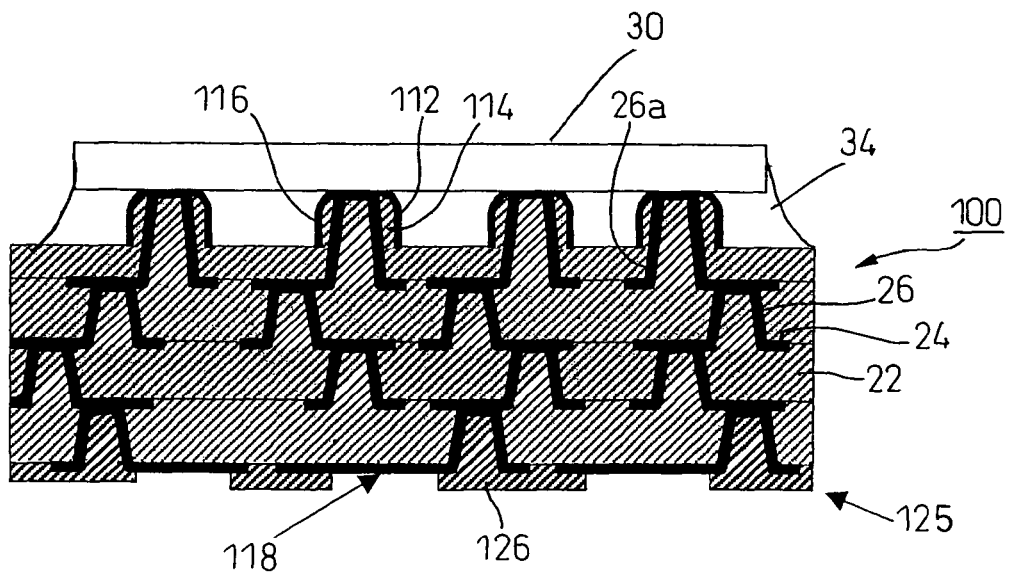
FIG. 6 is a cross-sectional view of a semiconductor device using a package according to the second embodiment.

FIG. 5 is a sectional view of the semiconductor package according to a second embodiment of the invention. FIG. 6 is a sectional view of a semiconductor device with the semiconductor element mounted on the semiconductor package according to the second embodiment.

In the semiconductor package 100 according to the second embodiment, the semiconductor element connection terminals on the upper surface of the uppermost layer are each formed of a bump 112 filled with the insulating resin 114 and covered with the metal layer 116, which bumps are projected upward from the upper surface of the package 100. The bumps 112, as in the first embodiment, are so structured that the interior thereof is filled with the insulating resin 114 and the surface thereof is covered with the metal layer 116 of gold or nickel.

On the other hand, the bottom surface of the bottom layer of the semiconductor package 100 is covered with the solder resist 125, and a multiplicity of lands or pads 118 covered by the nickel-gold plating making up the external connection terminals to mount the semiconductor package on other parts are exposed from the solder resist 125.

As in the first embodiment, the wiring layers 24 of each layer are electrically connected to each other through the layer connection via 26, and the metal layer 116 of the bumps 112 for mounting the semiconductor element is electrically connected to the lands or pads 118 making up the external connection terminals through the conductor via 26a, the wiring layers 24 and the layer connection via 26.

The other parts of the structure of the semiconductor package 100 according to the second embodiment are similar to those of the semiconductor package 10 according to the first embodiment shown in FIG. 3a.

As shown in FIG. 6, the semiconductor element 30 is mounted on the upper surface of the semiconductor package 100 according to the second embodiment. Specifically, the semiconductor element 30 is connected to the bumps 112 formed on the upper surface of the semiconductor package 100 and filled with the insulating resin 114 while being covered with the metal layer 116. In this case, as shown in FIG. 4, the solder bumps or the like for connecting the electrodes of the semiconductor element 30 are not required. Instead, the electrodes (not shown) of the semiconductor element 30 can be directly connected to the bumps 112 projected upward from the upper surface of the semiconductor package 100 with a small amount of solder.

In mounting the semiconductor device shown in FIG. 6 on a mounting board such as the mother board or the printed wiring board, pins or solder balls (not shown) providing the external connection terminals are coupled to the lands 118, and used as a PGA (pin grid array) or a BGA (ball grid array). Alternatively, as shown in FIG. 6, the lands 118 are used as a LGA (land grid array) of the external connection terminals. In the case where the assembly is formed as a LGA, the solder balls coupled to the pads of the mounting board are used for connection.

Figure 7:
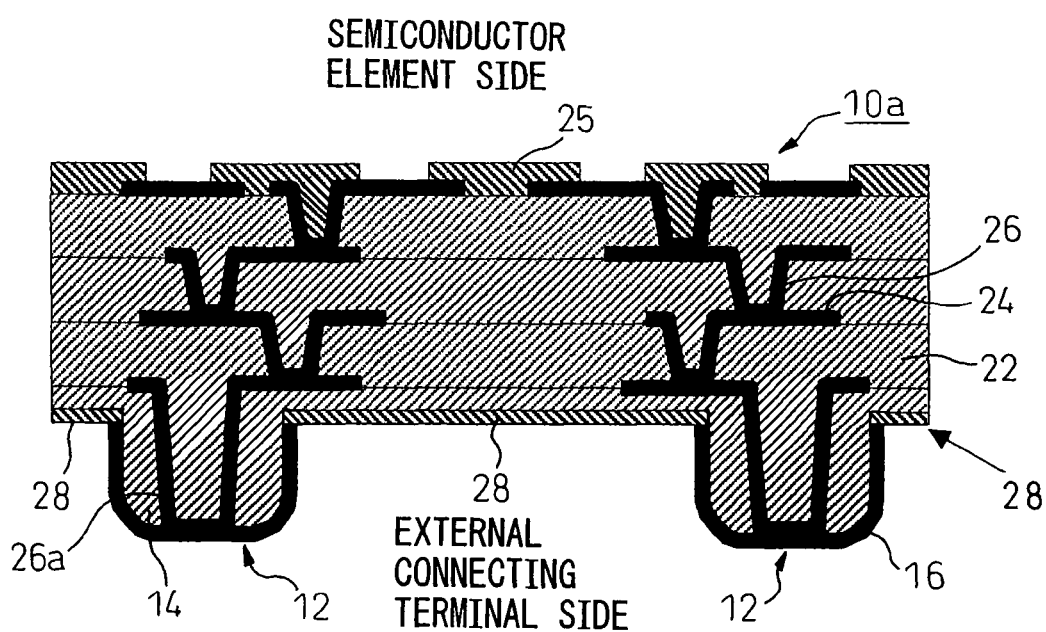
FIGS. 7-10 are cross-sectional views of semiconductor packages according to third, fourth, fifth and sixth embodiments, respectively, of this invention.

FIG. 7 is a sectional view showing a semiconductor package according to a third embodiment of the invention. The third embodiment has a similar configuration to the semiconductor package according to the first embodiment shown in FIG. 3a. Only the different points of the third embodiment are explained below. The lower surface of the bottom layer of the semiconductor package 10a is formed with a solder resist layer 28, so that the bumps 12 on the external connection terminal side projected downward from the lower surface of the bottom layer are partially exposed from the solder resist layer 28. The other parts of the configuration are similar to those of the semiconductor package according to the first embodiment shown in FIG. 3a.

Figure 8:
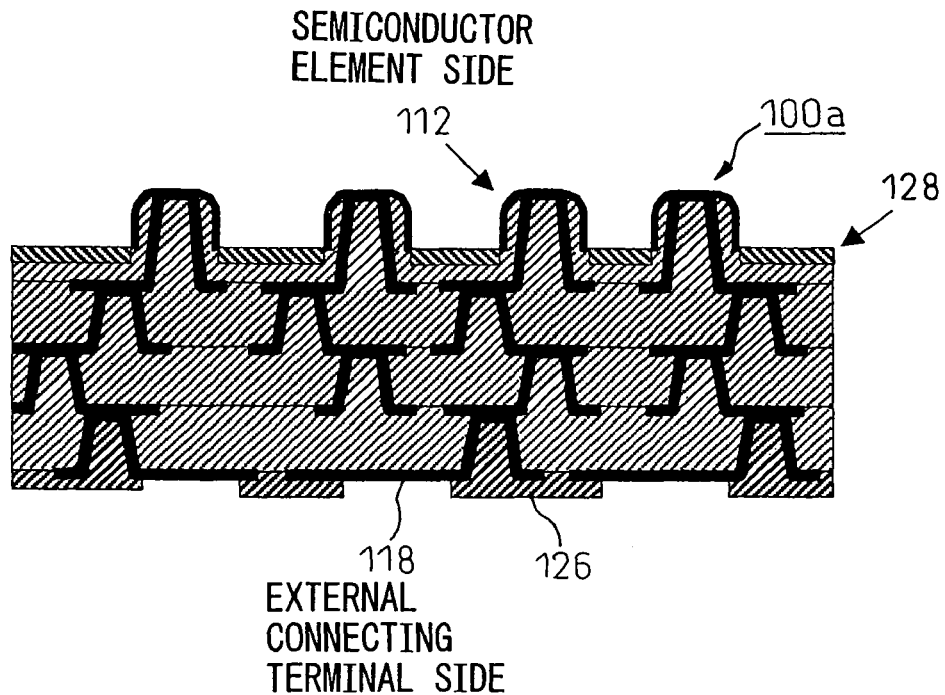

FIG. 8 is a sectional view of the semiconductor package according to a fourth embodiment of the invention. The fourth embodiment is configured similarly to the semiconductor package according to the second embodiment shown in FIG. 5. Only the different points of the fourth embodiment are described below. The upper surface of the uppermost layer of the semiconductor package 100a is formed with a solder resist layer 128, and the semiconductor element-connecting bumps 112 projected upward from the upper surface of the uppermost layer are exposed partially upward from the solder resist layer 128. The other parts of the configuration are similar to those of the semiconductor package according to the second embodiment shown in FIG. 5.

Figure 9:
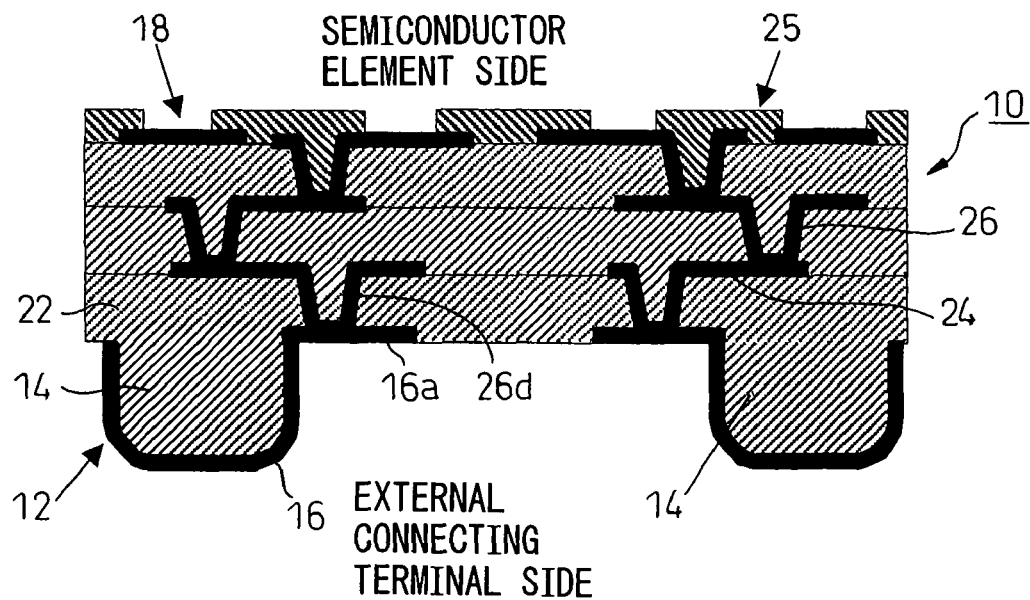

FIG. 9 is a sectional view of the semiconductor package according to a fifth embodiment of the invention. This fifth embodiment is different only in the structure of the via connection of the semiconductor package according to the first embodiment shown in FIG. 3. Specifically, according to the first embodiment, the conductor via 26a in contact with the metal layer 16 of the projected bumps 12 is passed through the insulating resin 14 filled in the bumps 12, while according to the fifth embodiment, the metal layer 16 covering the surface of the bumps 12 has an extension pad 16a extending to the lower surface of the bottom layer of the semiconductor package, and the conductor via 26d is connected to the extension pad 16a through the insulating resin layer 22 of the bottom layer. The other points of the configuration are similar to those of the semiconductor package according to the first embodiment shown in FIG. 3.

Figure 10:
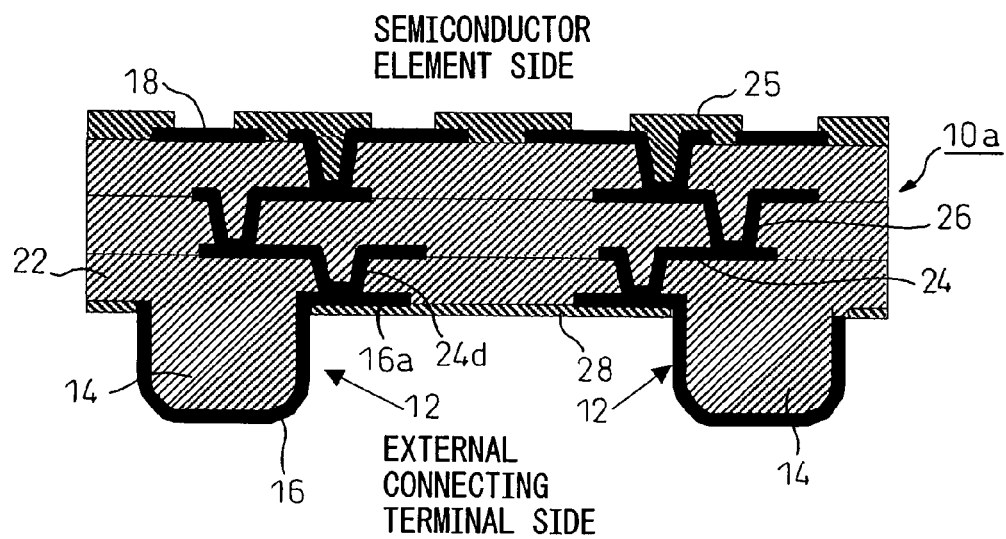

FIG. 10 is a sectional view showing a semiconductor package according to a sixth embodiment of the invention. This sixth embodiment has a similar via connection structure to the semiconductor package according to the fifth embodiment shown in FIG. 9. Specifically, the metal layer 16 covering the surface of the protruded bumps 12 has an extension pad 16a extending to the lower surface of the bottom layer of the semiconductor package, and the conductor via 24d is connected to the extension pad 16a through the insulating resin layer 22 of the bottom layer. Further, according to the sixth embodiment, as in the third embodiment shown in FIG. 7, the solder resist layer 28 is formed, on the lower surface of the bottom layer of the semiconductor package 10a, so that the bumps 12 on the external connection terminal side projected downward from the lower surface of the bottom layer are partly exposed from the solder resist layer 28.

Figure 11:
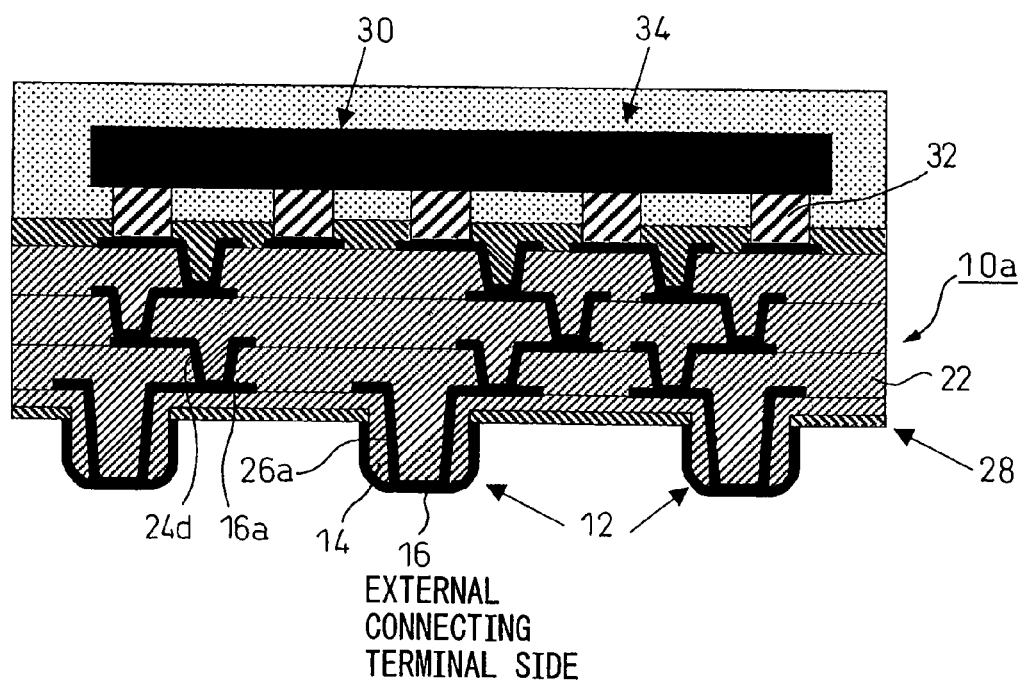
FIG. 11 is a cross-sectional view of a semiconductor device using the package of the third embodiment shown in FIG. 7.

FIG. 11 is a sectional view of a semiconductor device including a semiconductor package according to the third embodiment shown in FIG. 7. During the fabrication of the semiconductor package, the semiconductor element 30 is mounted and sealed with the seal resin 34. The semiconductor element connection terminals 18 are exposed to the upper surface of the uppermost layer of the semiconductor package 10a from the solder resist 25. Thus, the semiconductor element 30 having the electrode terminals 32 in the form of bumps is mounted on the semiconductor package 10a in such a manner that the electrode terminals 32 are electrically connected to the semiconductor element connection terminals 18, and the semiconductor element 30 is covered and sealed by the epoxy seal resin 34. In this way, a semiconductor device with the whole semiconductor element 30 covered by the seal resin 34 is completed. As shown in FIG. 4, the seal resin 34 (underfill resin) can of course be covered on the gap between the semiconductor element 30 and the upper surface of the semiconductor package 10a. The semiconductor element 30 may alternatively be connected to the terminals 18 by wire bonding (not shown) and mounted on the package.

Figure 12A:
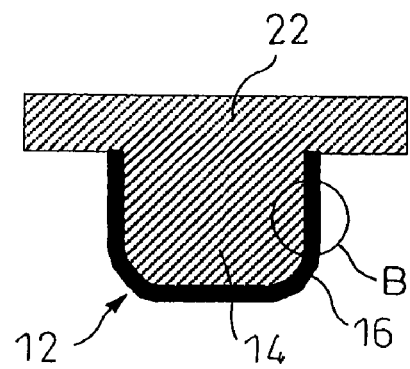
FIGS. 12($a$)-12($c$) are cross-sectional views showing structure of a bump.
Figure 12B:
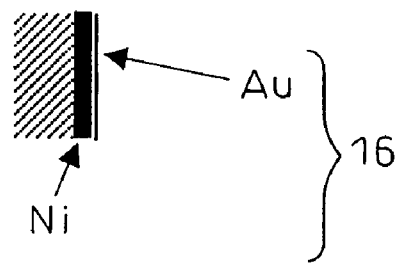
Figure 12C:
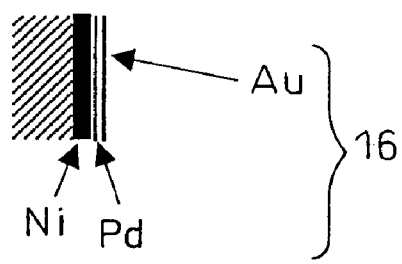

FIGS. 12a-12c are a sectional configurations of the bump of the semiconductor package according to the invention. In the semiconductor package according to the first to sixth embodiments described above, the bumps 12, 112 are filled with the insulating resin 14, 114 and covered with the metal layer 16, 116. As shown in FIGS. 12a, 12b, however, gold (Au) and nickel (Ni) may be plated on the obverse surface of the bumps. As an alternative, as shown in FIG. 12c, gold (Au), palladium (Pa) and nickel (Ni) are plated from the obverse surface of the bump. As another alternative, the combination of Au/Pd/Ni/Pd or Au/Pd/Ni/Cu may be plated from the obverse surface of the bump.

FIGS. 13a-13f, 14a-14b show the fabrication process of the semiconductor package according to the first embodiment.

First, as shown in FIG. 13a, a photoresist layer 42 is formed on a support member 40 made of a metal plate or a metal foil of copper or the like. The support member 40 is suitably made of copper, but may alternatively be formed of any of various metals including Fe—Ni alloy. This photoresist layer 42 is patterned by exposure and development thereby to form an opening of the photoresist layer 42 at a position corresponding to each terminal to be formed. After that, as shown in FIG. 13b, recesses 44 are formed by etching the portions of the support member 40 exposed from the photoresist layer 42. Further, as shown in FIG. 13c, the inner wall of each recess 44 is plated (with gold or the like) to form a metal layer 16 for the terminal. In the process, the electrolytic plating is suitably carried out using the support member 40 (metal plate) as a power feed layer. The metal layer 16 is formed of a material not etched by the etching solution at the time of etching off the metal of the support member 40. After that, the photoresist layer 42 is removed.

Next, as shown in FIG. 13d, the surface of the support member 40 formed with the recesses 44 and the interior of the recesses 44 are covered with the insulating resin thereby to form an insulating resin layer 22. As a result, the inner area of each recess 44 is also filled with the insulating resin 14. The insulating resin is made of an epoxy resin or a polyimide resin, for example. Next, as shown in FIG. 13e, the insulating resin 14 in each recess 44 is irradiated with the laser light to form a via hole 46. As shown in FIG. 13f, the wall surface of the via hole 46 and the surface of the insulating resin 22 are formed with a conductor via 26a and a wiring 24 by the semi-additive method or the like.

Figure 14A:
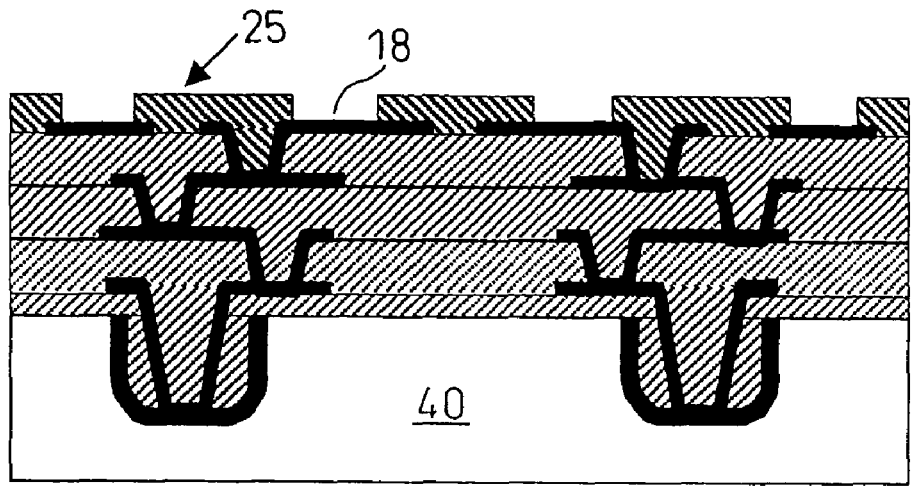

Next, the insulating resin layer 22 and the wiring layer 24 (including the layer connection via 26) are sequentially and alternately stacked by the build-up process, and a solder resist layer 25 is formed on the surface of the uppermost layer. After that, as shown in FIG. 14a, the connection terminals (lands) 18 on the semiconductor element-mounting side are exposed or otherwise the surface treatment is carried out for the uppermost layer on which the semiconductor element is mounted. The surface treatment of the semiconductor element-mounting surface is carried out by electrolytically plating nickel and gold on the surface of the terminal 18 using the support member (metal plate) 40, the conductor via 26a, the connection via 26, and the wiring layer 24, as a power feed plate.

Figure 14B:
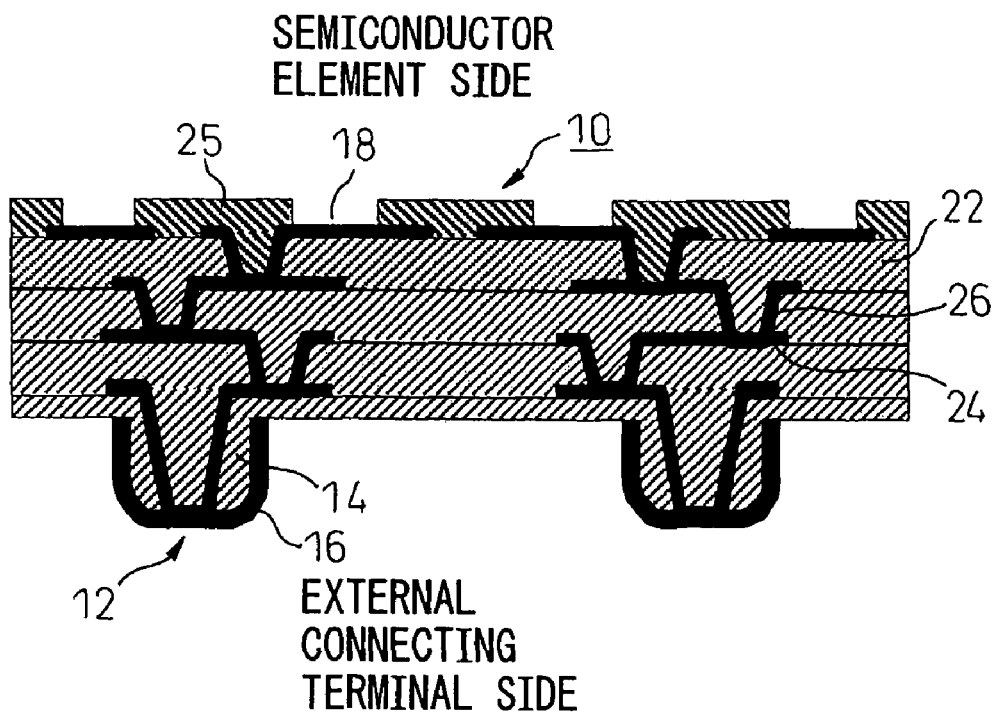

Next, as shown in FIG. 14b, the metal plate 40 making up the support member is etched off thereby to expose the external connection bumps 12 projected downward from the bottom layer of the semiconductor package. In the actual fabrication process, a plurality of packages are fabricated on one support member 40, and after removing the support member 40, cut off into individual packages.

Figure 15:
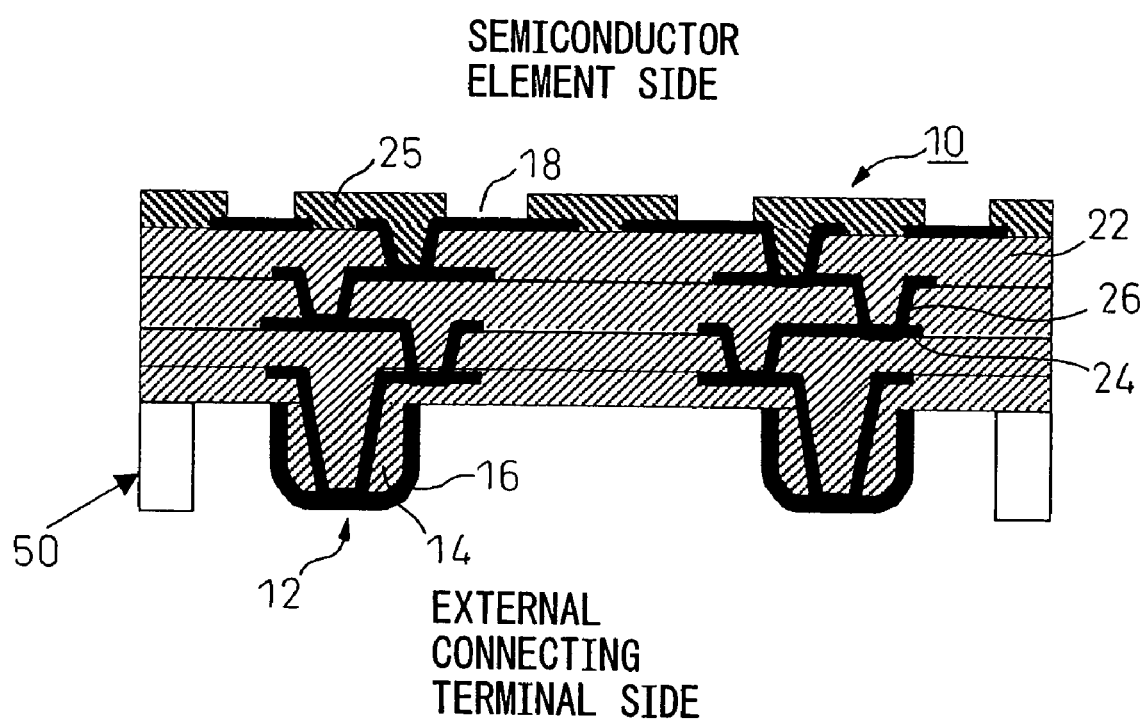
FIG. 15 shows a modified fabrication process of the semiconductor package of the first embodiment.

FIG. 15 shows a semiconductor package in the completed state following the steps of FIGS. 14a-14b. From the state of FIG. 14a, as shown in FIG. 14b, the metal plate 40 making up the support member is not completely etched off but the peripheral edge of the terminal surface of the support member is left in the form of frame without being etched off to form a reinforcing member 50. This frame-like reinforcing member 50 protects the external connection bumps 12 projected downward from the bottom layer of the semiconductor package 10.

Figure 16:
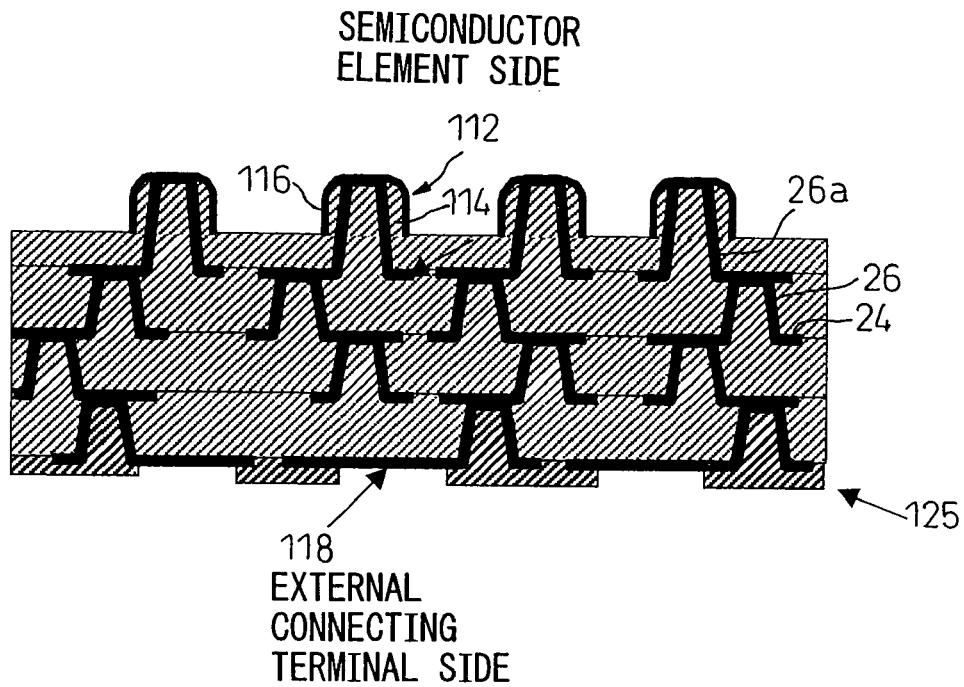
FIG. 16 shows a fabrication process of the semiconductor package of the second embodiment.

FIG. 16 shows a method of fabricating a semiconductor package according to the second embodiment of the invention. In this second embodiment, the terminals on the semiconductor element-mounting side are configured of bumps 112 filled with the insulating resin and covered with a metal layer. This semiconductor package can be fabricated with the bump terminals 112 projected on the semiconductor element-mounting side in exactly the same manner as in the semiconductor package fabrication method shown in FIGS. 13a-13f, 14a-14b.

Figure 17:
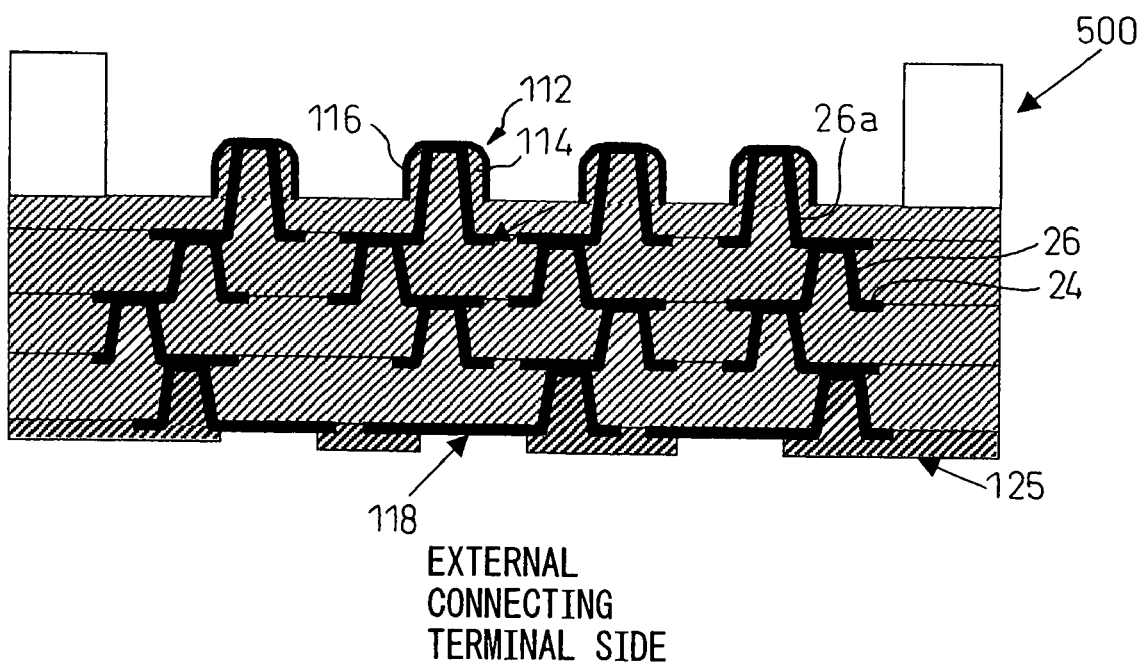
FIG. 17 shows a modified fabrication process of the semiconductor package of the second embodiment.

Similarly, as shown in FIG. 17, the metal plate 40 making up the support member is etched off in such a manner that the peripheral edge of the terminal surface of the bump 112 projected on the semiconductor element-mounting side of the support member 40 is left in the form of frame thereby to make up a reinforcing member 500.

Figure 18A:
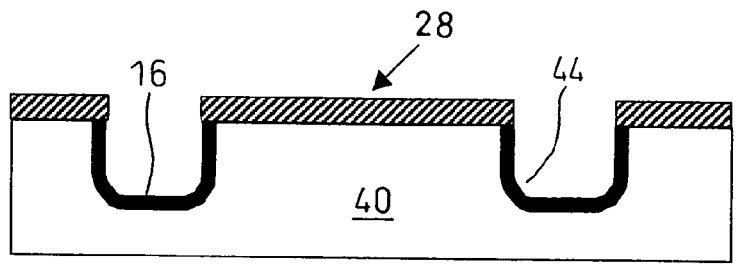
FIGS. 18($a$)-18($c$) show a fabrication process of the semiconductor packages according to the third embodiment.
Figure 18B:
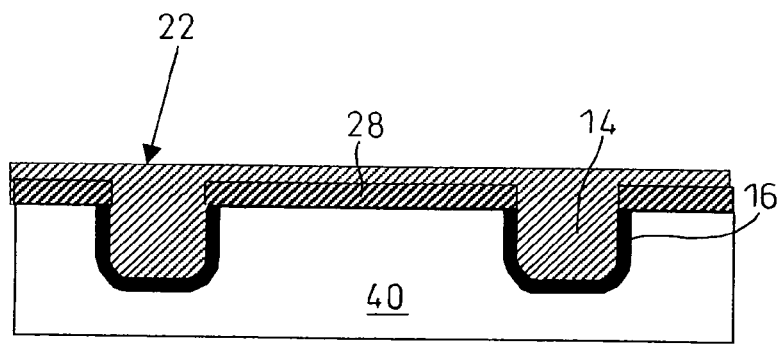
Figure 18C:
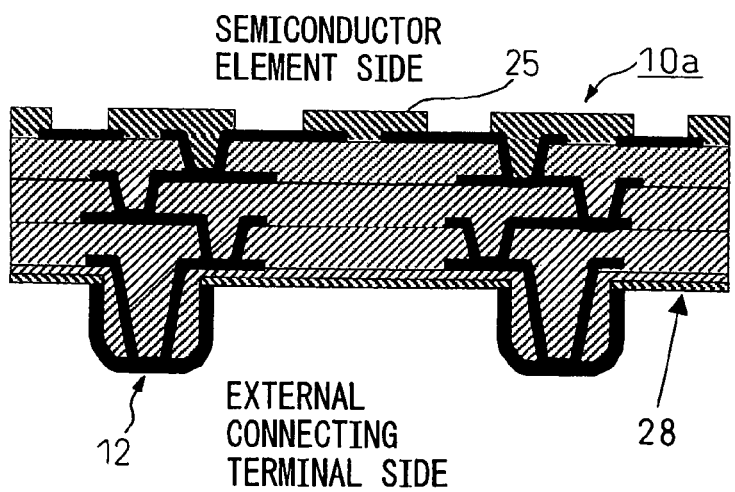

FIGS. 18a-18c show a method of fabricating a semiconductor package according to a third embodiment of the invention.

First, in the process similar to FIGS. 13a to 13c, recesses 44 are formed by etching the support member 40 of a metal plate, and the inner wall of each recess 44 is plated (with gold or the like) to form a terminal metal layer 16. Next, as shown in FIG. 18a, the recess-formed surface of the support member 40 except for the interior of the recesses 44 is formed with a solder resist layer 28. The solder resist may be any of an epoxy acryl resin, an epoxy resin and an acryl resin.

Next, as shown in FIG. 18b, the upper surface of the solder resist layer 28 and the interior of each recess 44 are covered with an insulating resin to form an insulating resin layer 22. As a result, the inner area of each recess 44 is also filled with the insulating resin 14. The insulating resin of an epoxy or a polyimide group may be used in this case as in the case described above. The resin of a similar group but different compositions are used for the solder resist layer 28 and the insulating resin layer 22.

The subsequent process is similar to the process described in FIGS. 13e, 13f and FIGS. 14a, 14b. Specifically, the insulating resin layer 22 and the wiring layer 24 (including the layer connection via 26) are sequentially and alternately stacked by the build-up method to form the semiconductor package 10a. After that, the pad 18 on the semiconductor element-mounting side is exposed from the solder resist layer 25 of the uppermost layer, and as shown in FIG. 18c, the metal plate 40 making up the support member is etched off. In this way, a semiconductor package 10a is produced in which the external connection bumps 12 projected downward from the bottom layer are exposed from the solder resist layer 28. In this case, the surface on the external connection bumps 12 side is also covered with the solder resist layer 28.

FIGS. 19a-19c show a method of fabricating a semiconductor package according to a fifth embodiment of the invention.

First, recesses 44 are formed by etching the support member 40 of a metal plate in a process similar to FIGS. 13a, 13b and after that, the resist is removed. Then, as shown in FIG. 19a, a plated resist layer 52 is newly formed in an area other than the recessed portion of the recesses 44 and the extension on the upper surface of the support member 40 adjacent to the recessed portion. Then, the metal layers 16, 16a of a gold or nickel plating are formed on the inner surface of each recess 44 and the extension of the peripheral edge of each recess 44.

After removing the plated resist layer 52, as shown in FIG. 19b, the recessed portion and the interior of each recess 44 of the support member 40 including the upper surface of the metal layer 16a are covered with an insulating resin thereby to form an insulating resin layer 22. As a result, the inner area of each recess 44 is also filled with the insulating resin 14. The insulating resin of, for example, epoxy or polyimide group is used.

The subsequent steps are similar to those shown in FIGS. 13e, 13f, and FIGS. 14a, 14b, at which the semiconductor package 10 is formed by the build-up method. In the process, as shown in FIG. 13e, the via hole 46 is not formed in the insulating resin 14 in the recess 44 but a via hole 54 is formed in the insulating resin layer 22 as shown in FIG. 19c, and an extension pad (metal layer) 16a located in the extension on the peripheral edge of each recess 44 is exposed at the lower end of the via hole 54 so that a wiring 24 including the conductor via 26d is formed on the bottom and wall surfaces of the via hole 54.

In subsequent steps, as in the aforementioned embodiments, the insulating resin 22 and the wiring layer 24 (including the layer connection via 26) are sequentially and alternately formed and stacked by the build-up method. In this way, the semiconductor package 10a is formed and the support member 40 is removed.

Figure 20A:
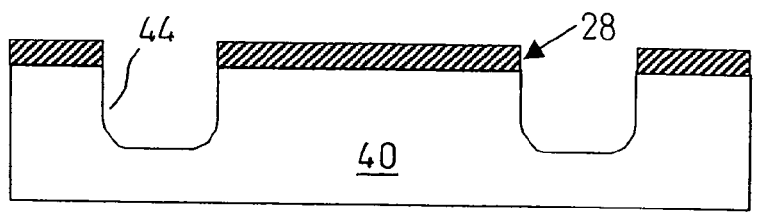
FIGS. 20($a$)-20($c$) show a fabrication process of the semiconductor packages according to the sixth embodiment.
Figure 20B:
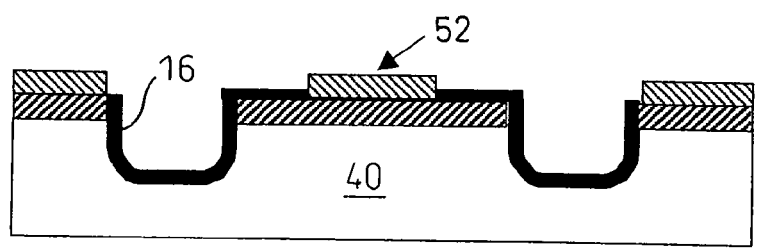
Figure 20C:
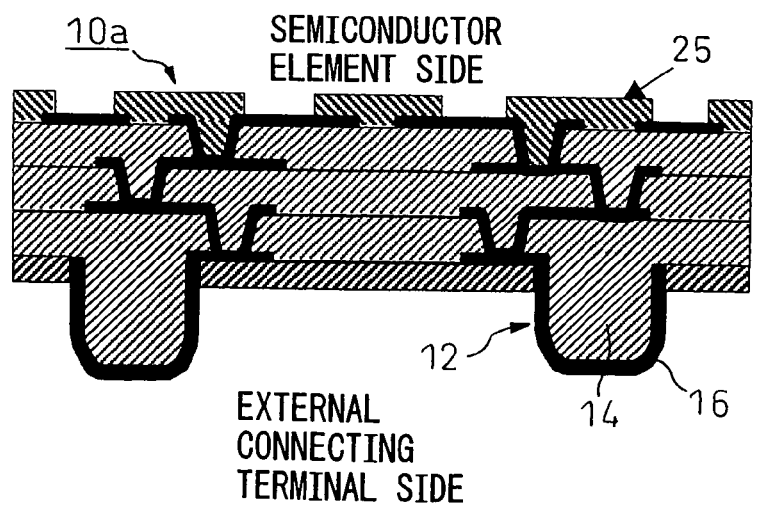

FIGS. 20a-20c show a method of fabricating a semiconductor package according to a sixth embodiment of the invention. The semiconductor package can be fabricated in similar manner also in this sixth embodiment, wherein the solder resist layer 28 is formed on the lower surface of the bottom layer of the semiconductor package 10a, so that the external connection terminal-side bumps 12 projected downward from the lower surface of the insulating resin 22 of the bottom layer are partially exposed from the solder resist layer 28.

Specifically, as shown in FIG. 20a, each recess 44 is formed on the support member 40 of a metal plate, after which the solder resist layer 28 is formed on the recess-formed surface of the support member other than the interior of the recesses 44. After that, as shown in FIG. 20b, a plated resist layer 52 is formed anew in an area other than the recesses 44 and the extension on the upper surface of the support member 40 adjacent to the recessed portions. Then, metal layers 16, 16a including a gold or nickel plating layer are formed in the inner surface of the recesses 44 and the extension of the peripheral edge of each recess. Subsequently, the insulating resin 22 and the wiring layer 24 are stacked sequentially and alternately in a similar fashion by the build-up method thereby to form a semiconductor package 10a, after which the support member 40 is removed as shown in FIG. 20c.

Also in the case of the package having a bump structure projected from the semiconductor element terminal connection side, a via hole can be opened by laser or the like and a conductor via similar to the conductor via 26d shown in FIG. 19c can of course be formed. Similarly, in the case of a package having a bump structure projected from the semiconductor element connection terminal side, the surface for mounting the semiconductor element can of course be covered with a solder resist layer like the solder resist layer 28 shown in FIG. 20c.

Figure 21A:
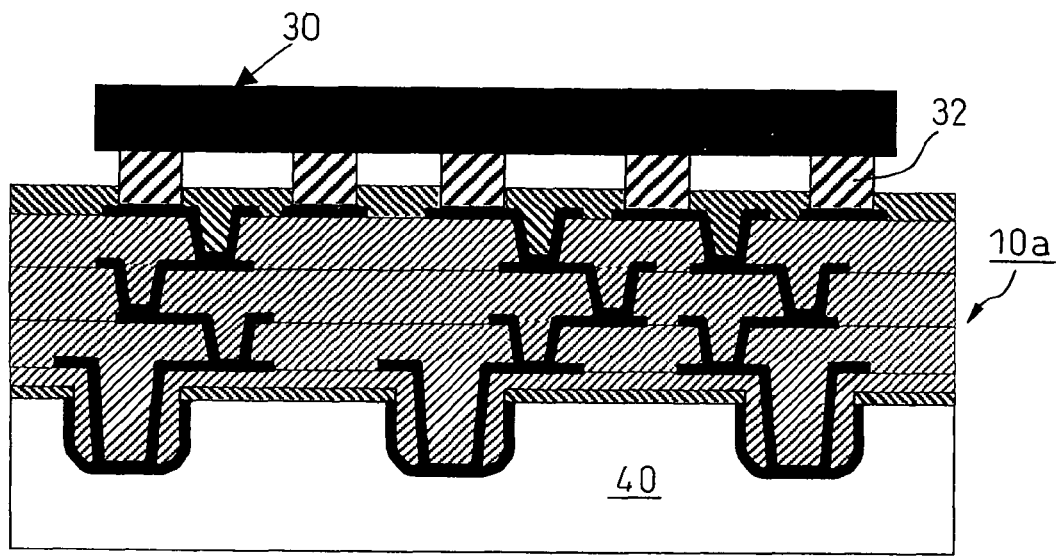
FIGS. 21(a)-21(c) show a fabrication process of a semiconductor device using the packages of the third embodiment.
Figure 21B:
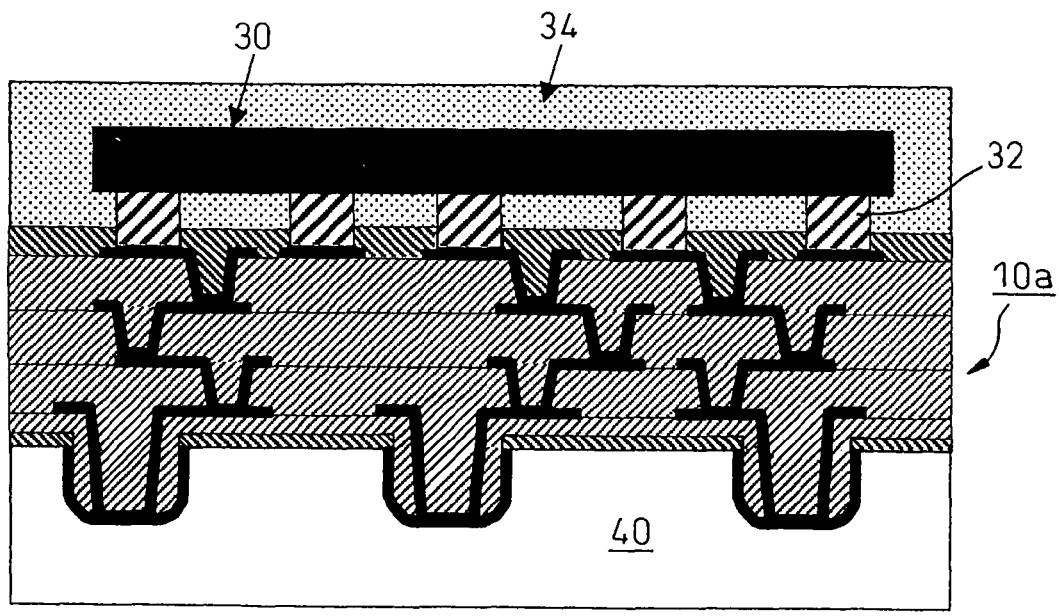
Figure 21C:
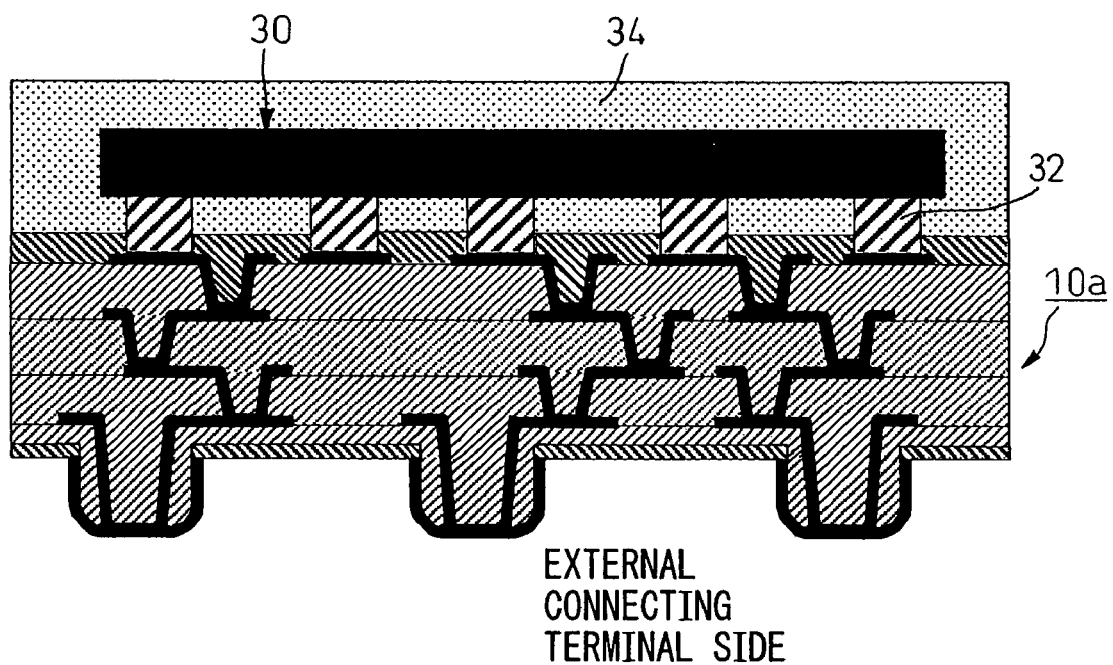

FIGS. 21a-21c show the fabrication process of the semiconductor package according to the third embodiment in which, before etching off the metal plate 40 making up the support member as shown in FIG. 18c after stacking the insulating resin layer 22 and the wiring layer 24 sequentially and alternately by the build-up method as shown in FIG. 18b, the semiconductor element 30 is mounted as shown in FIG. 21a. In this case, the semiconductor element connection terminals 18 are exposed from the solder resist 25 on the upper surface of the uppermost layer of the semiconductor package 10a. Thus, the semiconductor element 30 having the bumps 32 of solder or gold as an electrode is mounted on the semiconductor package 10a in such a manner that the electrode terminals 32 are electrically connected to the semiconductor element connection terminals 18.

Next, as shown in FIG. 21b, the semiconductor element 30 is covered and sealed by the epoxy seal resin 34. In this case, the semiconductor element 30 may be sealed by the seal resin 34 (underfill resin) in the form shown in FIG. 4. In this way, a semiconductor device with the whole semiconductor element 30 covered by the seal resin 34 is completed on the support member 40. The semiconductor element 30 may alternatively be connected to the terminal 18 by wire bonding (not shown) and sealed with the seal resin 34. As shown in FIG. 21c, even after completing a semiconductor device in this way, the same semiconductor device as the one shown in FIG. 11 can be produced by etching off the metal plate 40 constituting the support member.

Figure 22A:
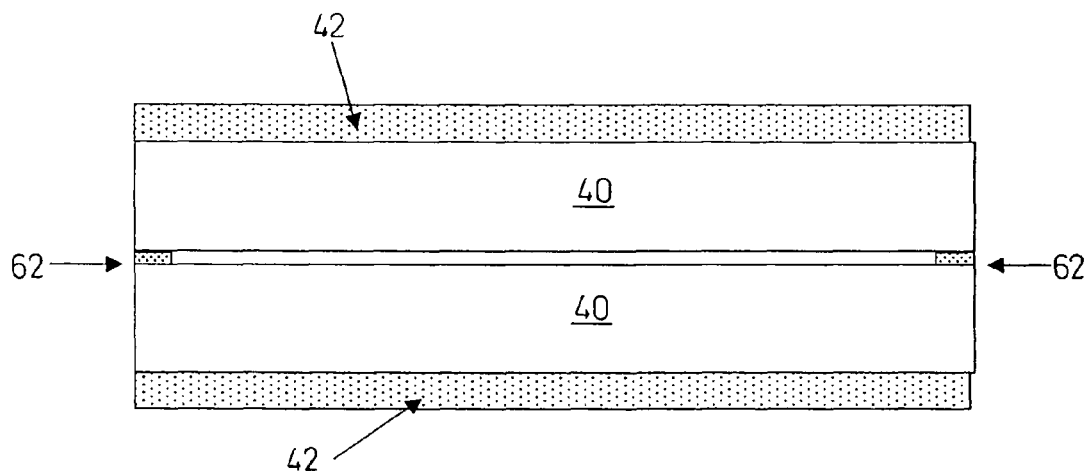
FIGS. 22(a)-22(b) and 23(a)-23(b) show a fabrication method for forming a semiconductor package on each side of a support member.
Figure 22B:
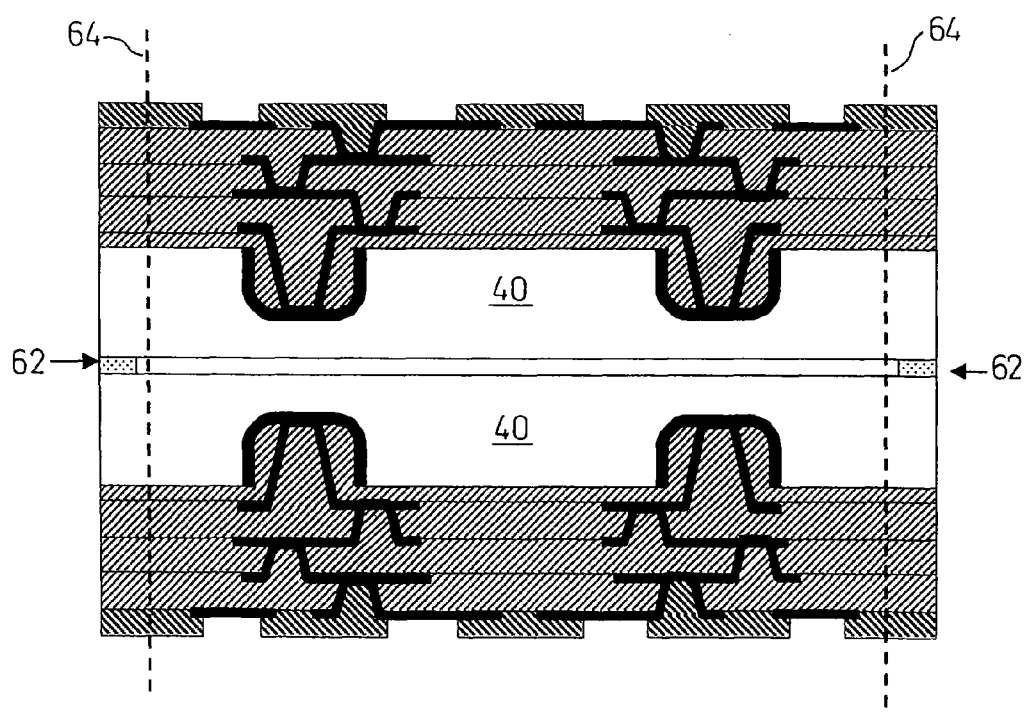

FIGS. 22a-22b and 23a-23b show a fabrication method to form a semiconductor package on each side of the support member. In this case, first, as shown in FIG. 22a, support members 40, 40 of two metal plates are bonded to each other along the peripheral edges thereof by the adhesive 62. In the same steps as in the semiconductor package fabrication method according to the aforementioned embodiments, the resist layers 42, 42 are formed on the two surfaces of the support members 40, 40, and recesses are formed. Then, the insulating resin layer 22 and the wiring layer 24 are sequentially and alternately stacked by the build-up method, after which as shown in FIG. 22b, the peripheral edge area including the portion bonded by the adhesive 62 are cut off along the cutting lines 64, 64, so that the support members 40, 40 and the semiconductor package formed on the support members 40, 40 are separated into two parts.

Figure 23A:
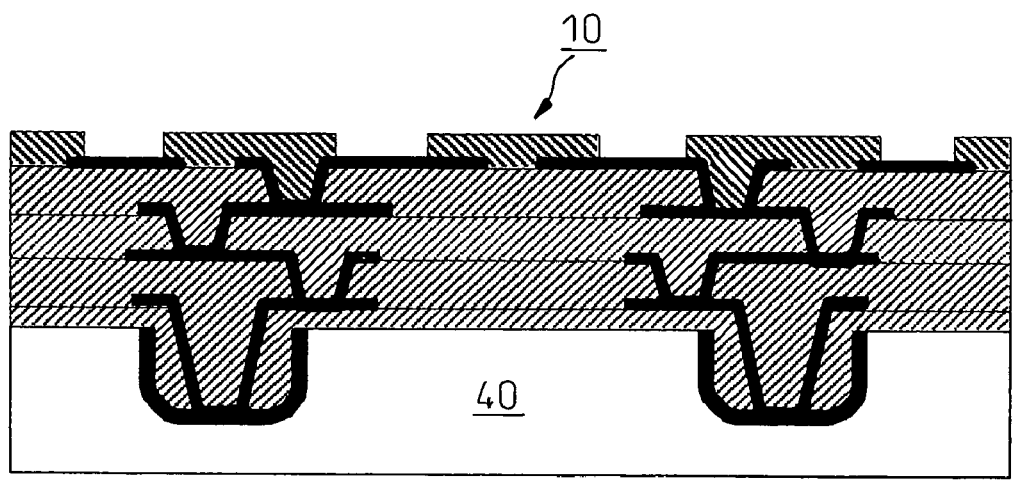
Figure 23B:
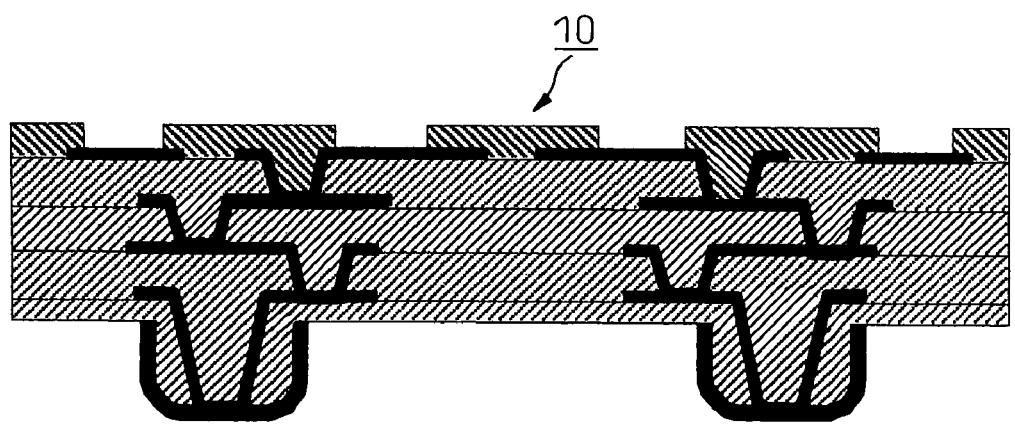

FIG. 23a shows one of the two parts into which the support members 40, 40 are separated. As in each semiconductor package fabrication method according to the aforementioned embodiments, each support member 40 is etched off and a semiconductor package is produced as shown in FIG. 23b.

Figure 24A:
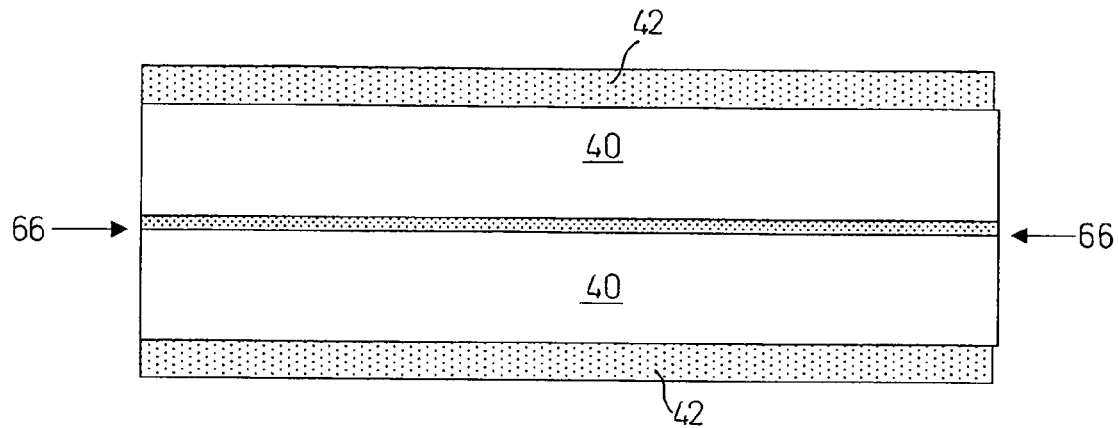
FIGS. 24(a)-24(b), FIGS. 25(a)-25(b) and FIGS. 26(a)-26(b) show modified fabrication methods, respectively, for forming a semiconductor package on each side of a support member.
Figure 24B:
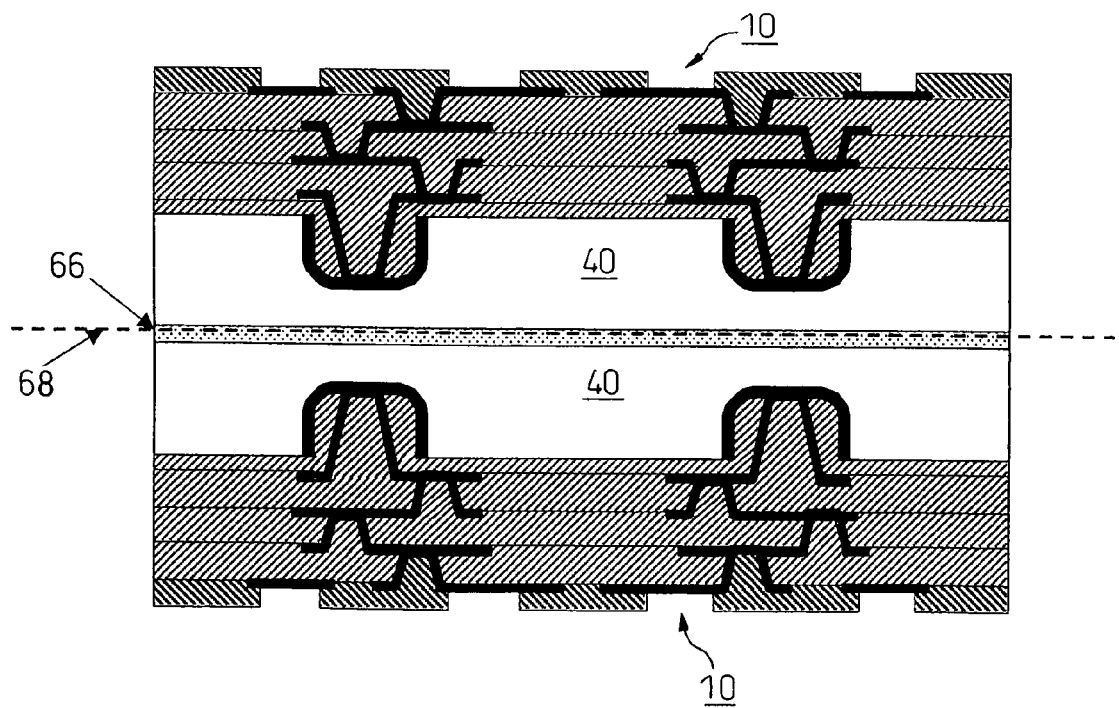

FIGS. 24a-24b show a process to form a semiconductor package on each surface of the support member according to a modification of the embodiments. In this case, as shown in FIG. 24a, the whole reverse surfaces of the support members 40, 40 of two metal plates are attached to each other by a bonding layer 66. In the same process as the semiconductor package fabrication method according to each embodiment described above, the resist layers 42, 42 are formed on the two surfaces of the support members 40, 40, and recesses are formed. Then, the insulating resin layer 22 and the wiring layer 24 are sequentially and alternately stacked by the build-up method, after which, as shown in FIG. 24b, the assembly is cut off along the cutting line 68 on the portion attached by the bonding layer 66. In this way, the support members 40, 40 and the semiconductor package formed thereon are separated into two parts. In the subsequent process, the two separated semiconductor packages are each etched to remove the support members 40.

Figures 25A, 25B:
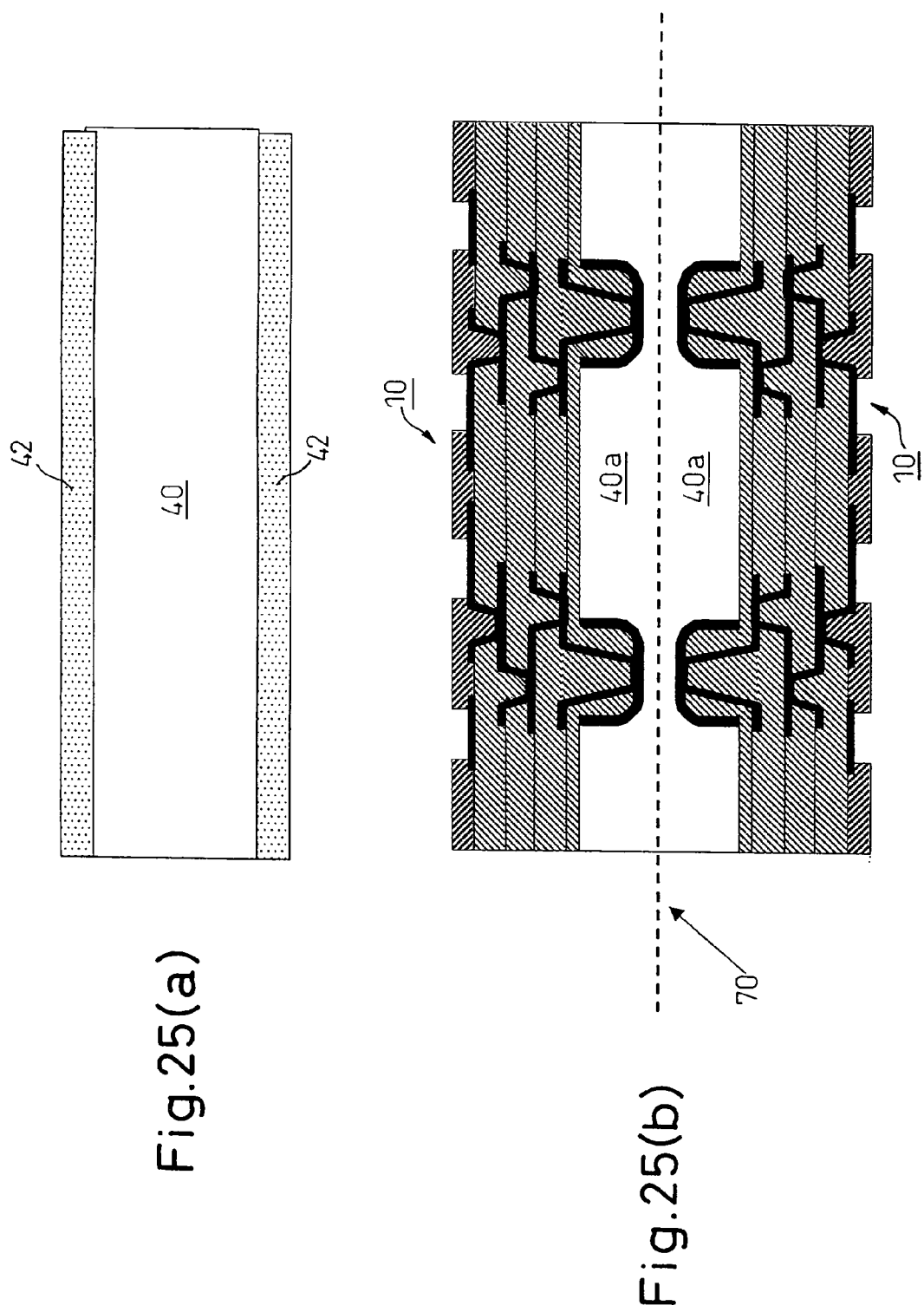

FIGS. 25a-25b show a process to form a semiconductor package on each surface of the support member according to another modification of the embodiments. In this case, first, as shown in FIG. 25a, the resist layers 42, 42 are formed on the two surfaces of a single support member 40 of a metal plate. In subsequent processes, recesses are formed and the insulating resin layer 22 and the wiring layer 24 are stacked sequentially and alternately by the build-up method. After that, as shown in FIG. 25b, the support member 40 is cut along the cutting line 70 at about the middle point of the thickness using the slicer. In this way, the two support members 40a, 40a and the semiconductor packages formed thereon are produced. In the subsequent process, the two semiconductor packages thus obtained are etched to remove the support members 40a.

Figure 26A:
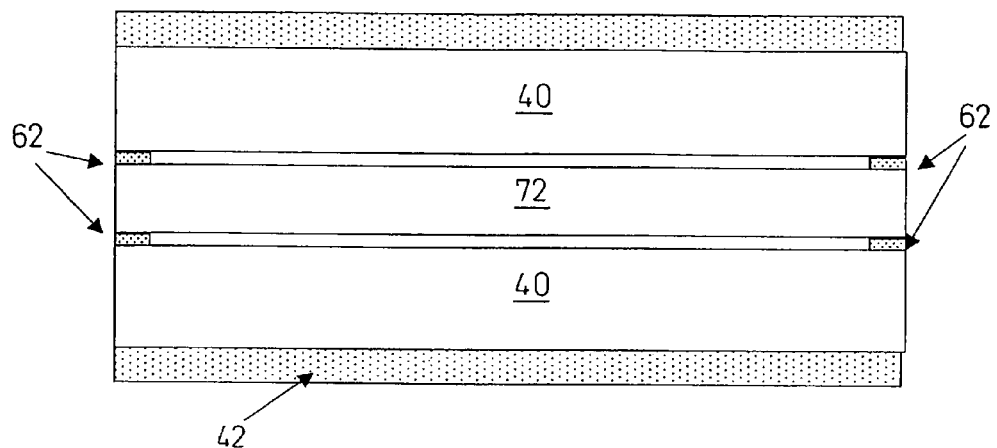
Figure 26B:
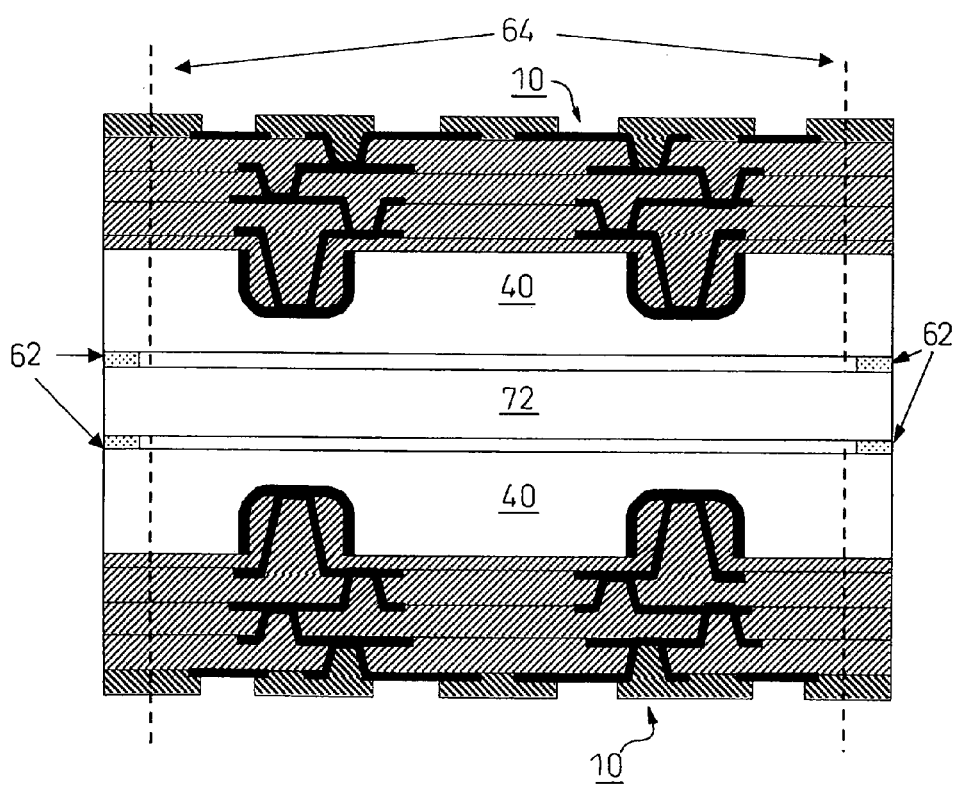

FIGS. 26a-26b show a process to form a semiconductor package on each surface of the support member according to still another modification of the embodiments. In this case, first, as shown in FIG. 26a, a reinforcing plate 72 is held between the support members 40, 40 of two metal plates, and these three plates are attached to each other along the peripheral edges thereof using the adhesive 62. The reinforcing plate 72 of any material including resin or metal can be used as far as the required strength can be maintained. The resist layers 42, 42 are formed on the two surfaces of the support members 40, 40 and recesses formed by the same process as the semiconductor package fabrication process according to each embodiment described above. After stacking the insulating resin layer 22 and the wiring layer 24 sequentially and alternately by the build-up method, as shown in FIG. 26b, the peripheral edge areas including the portion attached by the adhesive 62 are cut along the cutting lines 64, 64, so that the support members 40, 40 and the semiconductor packages formed on the support members 40, 40 are separated into two parts. At the same time, the reinforcing plate 72 held between the support members 40, 40 is also separated. After that, the two semiconductor packages thus obtained are etched to remove the support members 40, as in the aforementioned cases.

Figure 27:
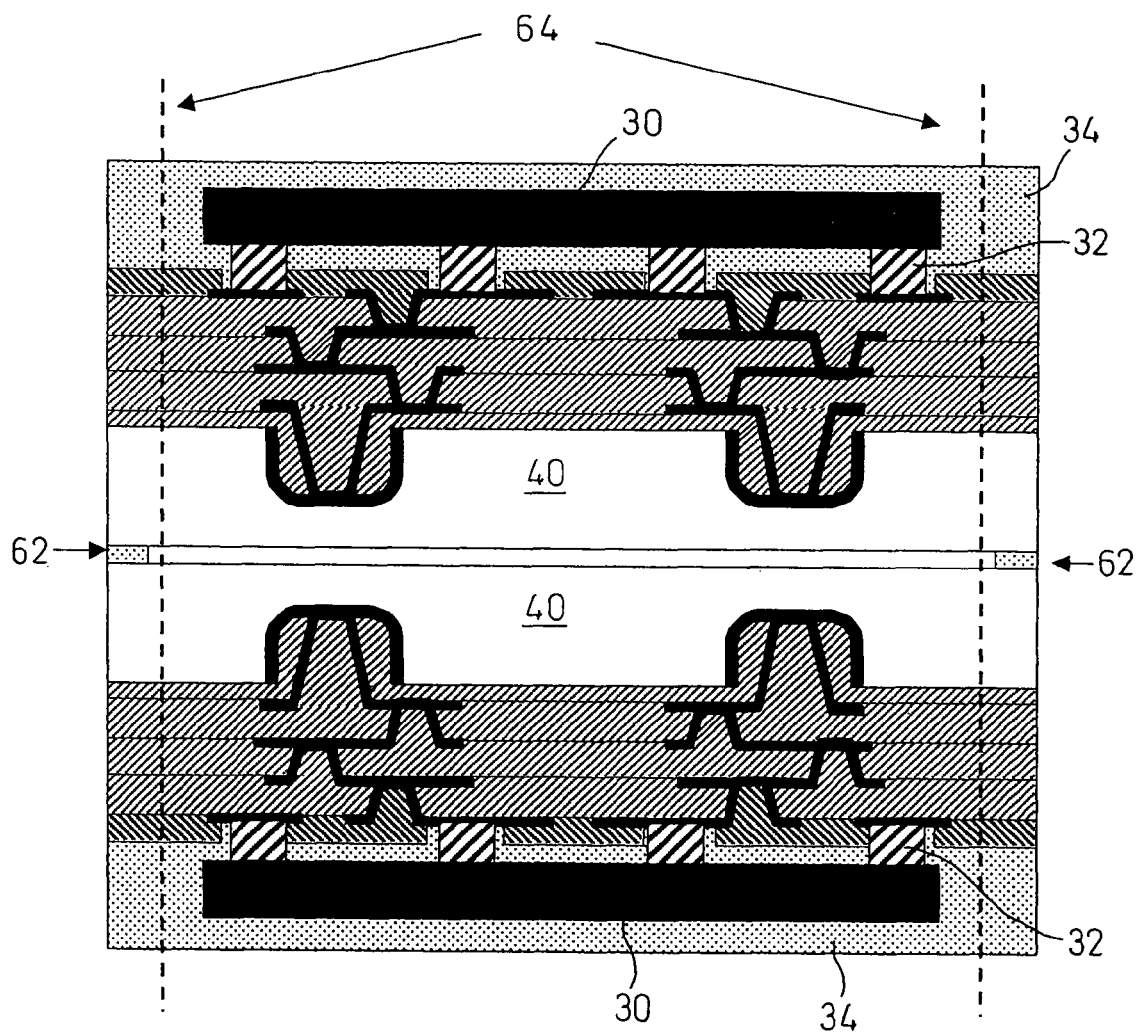
FIG. 27 shows a fabrication method for forming a semiconductor device on each side of a support member.

FIG. 27 shows a fabrication process to form a semiconductor package on each surface of the support member shown in FIGS. 22, 23. In this process, before the support members 40, 40 formed with the semiconductor packages are separated from each other, a semiconductor element 30 is mounted on each semiconductor package and sealed with the seal resin to form a semiconductor device, after which the support members 40, 40 are etched off.

Also in the modification shown in FIGS. 24 to 26, the semiconductor elements 30 can of course be mounted on the semiconductor packages before separating the support members 40, and after forming the semiconductor devices by sealing the semiconductor elements 30 with the seal resin, the support members 40 can be etched off.

Further, after separating the two support members 40, 40, the semiconductor element 30 can be mounted and sealed with resin to complete a semiconductor device, after which the support members 40, 40 can be etched off.

FIGS. 28a-28f, 29a-29b show a method of fabricating a semiconductor package having a solder resist layer according to a modification of the third embodiment of the invention.

Figure 28A:
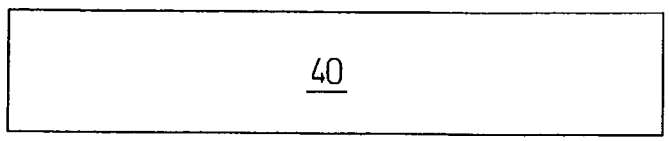
FIGS. 28(a)-28(f) and FIGS. 29(a)-29(b) show a modified fabrication method of the semiconductor package, having a solder resist layer, of the third embodiment.
Figure 28B:
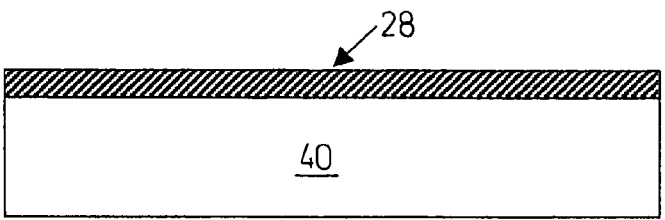
Figure 28C:
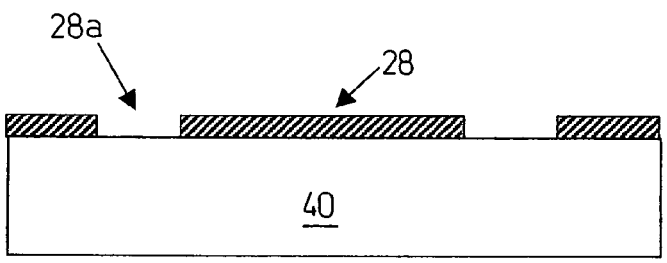
Figure 28D:
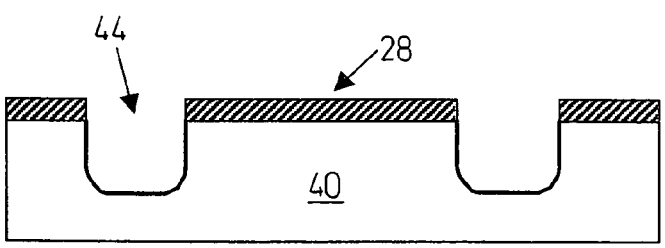

As shown in FIG. 28a, a support member 40 of a metal plate such as a copper plate is prepared. Next, as shown in FIG. 28b, a solder resist layer 28 of photosensitive resin is formed on the surface of the support member 40 by coating the resist resin or attaching the dry film resist. The solder resist layer 28 is patterned by exposure and development, and as shown in FIG. 28c, an opening 28a of the solder resist layer 28 is formed at each position where the terminal is to be formed. After that, as shown in FIG. 28d, the portion of the support member 40 is etched through the opening 28a exposed from the solder resist layer 28 to form a corresponding recess 44.

Figure 28E:
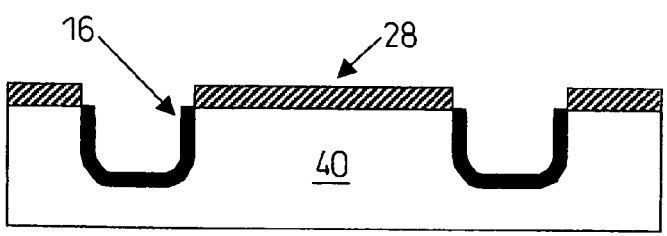
Figure 28F:
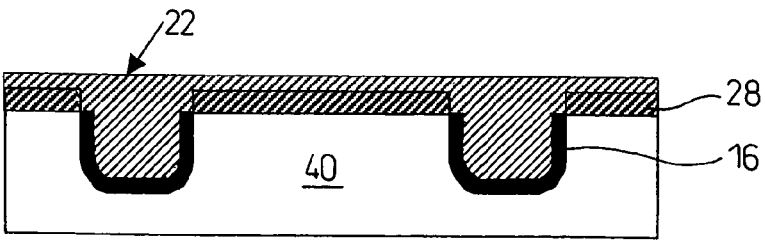

Next, as shown in FIG. 28e, the inner wall of each recess 44 is plated (with gold) to form a metal layer 16 as a terminal. In this case, the electrolytic plating is preferably used with the support member 40 of a metal plate as a power feed layer. The metal layer 16 may be formed of any material not melted in the etching solution when removing the metal of the support member 40 by etching. Before forming the metal layer 16 by plating, the reverse surface of the support member 40 is sealed by a masking jig (not shown). Next, as shown in FIG. 28f, each recess 44 is filled with the insulating resin, while at the same time forming the insulating resin layer 22 over the surface of the support member 40. In this case, the resin is coated in such a manner as to fill each recess 44, or a resin film is attached by adhesive. The insulating resin of either epoxy resin or polyimide resin, for example, can be used.

Figure 29A:
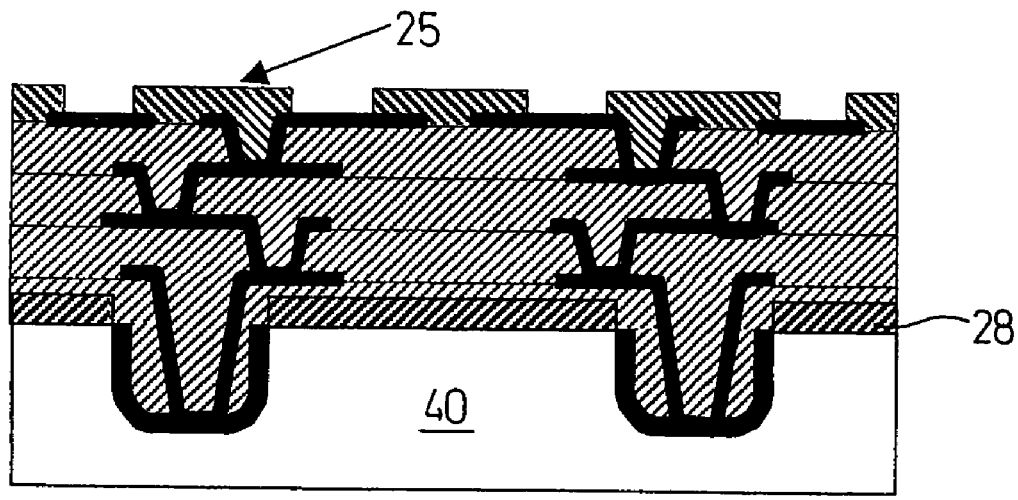

Subsequently, in the steps similar to those shown in FIG. 13e and subsequent steps, the laser light is radiated on the insulating resin 14 in each recess 44 thereby to form a via hole. The wall surface of the via hole and the surface of the insulating resin layer are formed with a conductor via 26a and wiring 24 by a semi-additive method or the like. Then, the insulating resin layer 22 and the wiring layer 24 (including the layer connection via 26) are sequentially and alternately stacked by the build-up method, so that a solder resist layer 25 is formed on the surface of the uppermost layer. The uppermost layer providing the surface where the semiconductor element is mounted is subjected to the surface treatment to expose the connection terminals (lands) 18 on the semiconductor element-mounting side. The surface treatment of the surface where the semiconductor element is mounted is carried by electrolytically plating the surface of the terminal 18 with nickel and gold with the support member (metal plate) 40 as as a power feed plate (FIG. 29a).

Figure 29B:
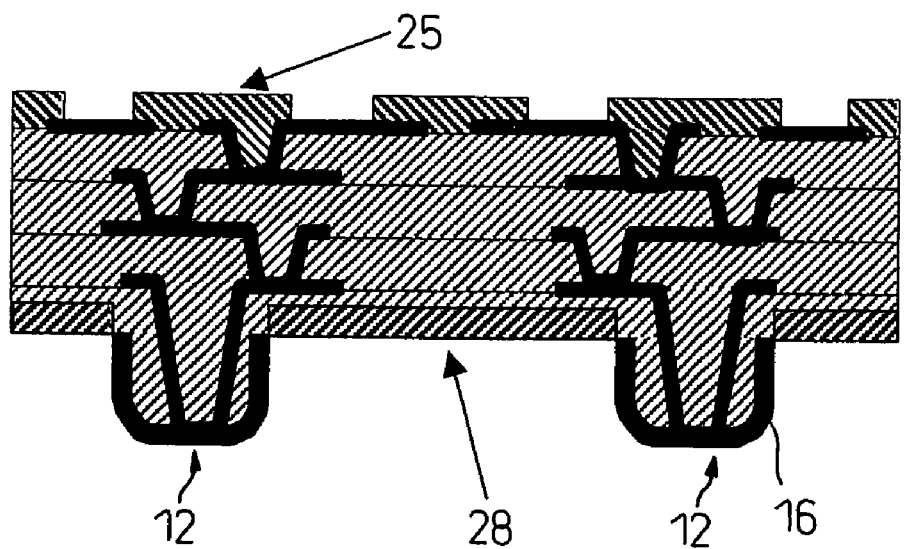

Next, the metal plate 40 constituting the support member is etched off thereby to expose the external connection bumps 12 projected downward from the bottom layer of the semiconductor package (FIG. 29b). In the actual fabrication process, a plurality of packages are fabricated on a single support member 40 and, after removing the support member 40, cut into individual packages.

Figure 30A:
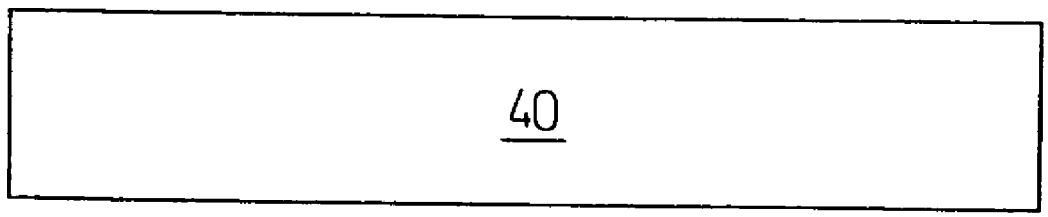
FIGS. 30(a)-30(b) show another modified fabrication method of the semiconductor package of the third embodiment.
Figure 30B:
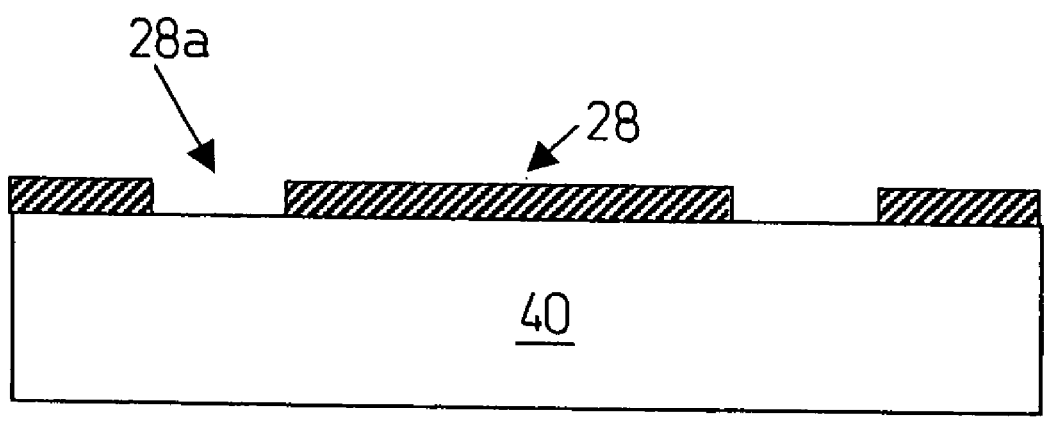

FIGS. 30a-30b show a semiconductor package fabrication method according to still another modification of the third embodiment of the invention. Unlike in FIG. 28 in which the solder resist layer 28 formed on the surface of the support member 40 is exposed and developed to form an opening, the method according to this modification is such that, as shown in FIG. 30a, a support member 40 of a metal plate of copper or the like is prepared, after which, as shown in FIG. 30b, a solder resist layer 28 having openings 28a is formed at the time of printing the surface of the support member 40 by the screen printing method or the jet ink printing method. In subsequent steps, the semiconductor package is formed in the same manner as in the steps including and subsequent to FIG. 28d.

FIGS. 31a-31e, 32a-32b show a semiconductor package fabrication method having an extension according to a modification of the sixth embodiment of the invention.

First, in the same process as the steps shown in FIGS. 28a to 28e, a solder resist layer 28 is formed on the surface of the support member 40, and so is a metal layer 16 by electrolytic plating on the inner surface of each recess 44. In this case, the solder resist pattern having openings can of course be formed by the screen printing method or the ink jet printing method as shown in FIGS. 30a, 30b.

Figure 31A:
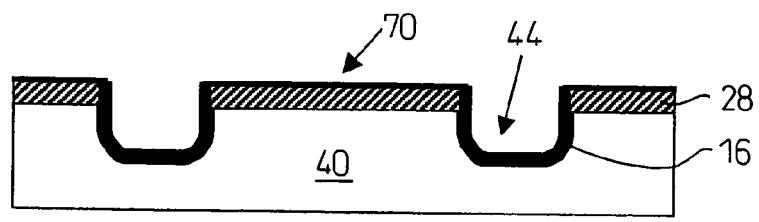
FIGS. 31(a)-31(e) and FIGS. 32(a)-32(b) show a fabrication method of the semiconductor package, having an extension, of the sixth embodiment.

After that, as shown in FIG. 31a, a second metal layer 70 providing a power feed layer for electrolytic plating in the next step is formed by electroless plating or sputtering on the metal layer 16 of the inner wall of each recess and the solder resist layer 28. This second metal layer 70 is formed of chromium and copper, for example, stacked in that order.

Figure 31B:
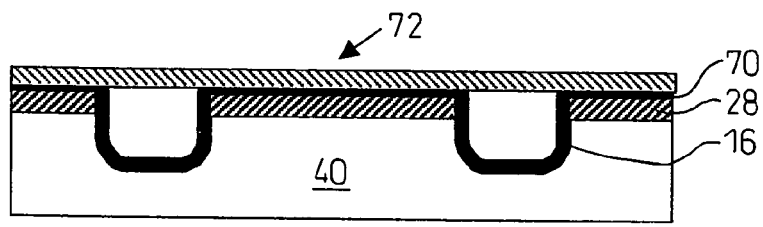
Figure 31C:
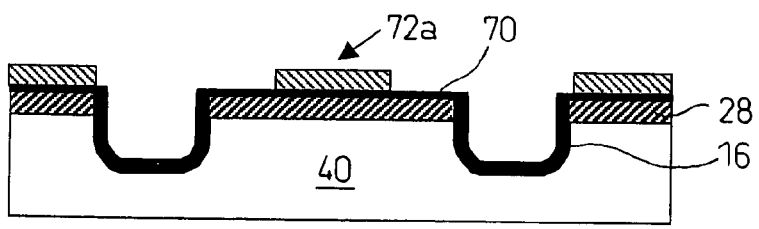

Next, a plated resist layer 72 is formed by a dry film resist on the second metal layer 70 (FIG. 31b). This plated resist layer 72 is patterned by exposure and development in such a manner as to expose the second metal layer 70 on the inner wall of the recess and the second metal layer 70 forming the metal extension, thereby producing a resist pattern 72a (FIG. 31c).

Figure 31D:
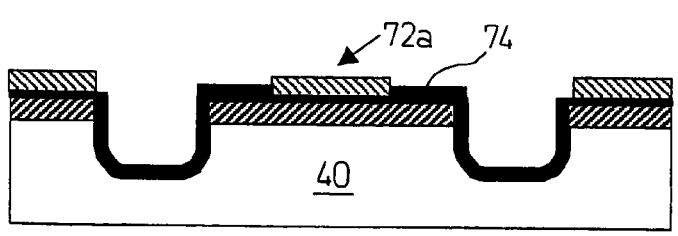
Figure 31E:
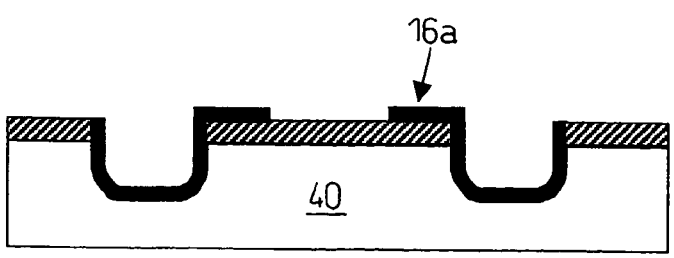

Then, the electrolytic plating is carried with the power supplied from the support member 40 and the second metal layer 70 thereby to form a metal extension 74 (FIG. 31d). Next, the plated resist pattern 72a is removed, and further, the second metal layer 70 existing in other than the portion under each metal extension 74 is etched off (FIG. 31e).

Figure 32A:
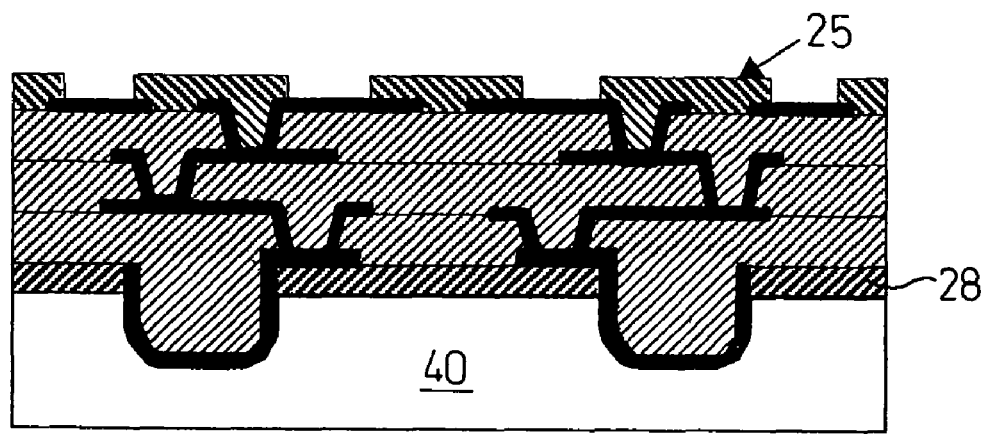
Figure 32B:
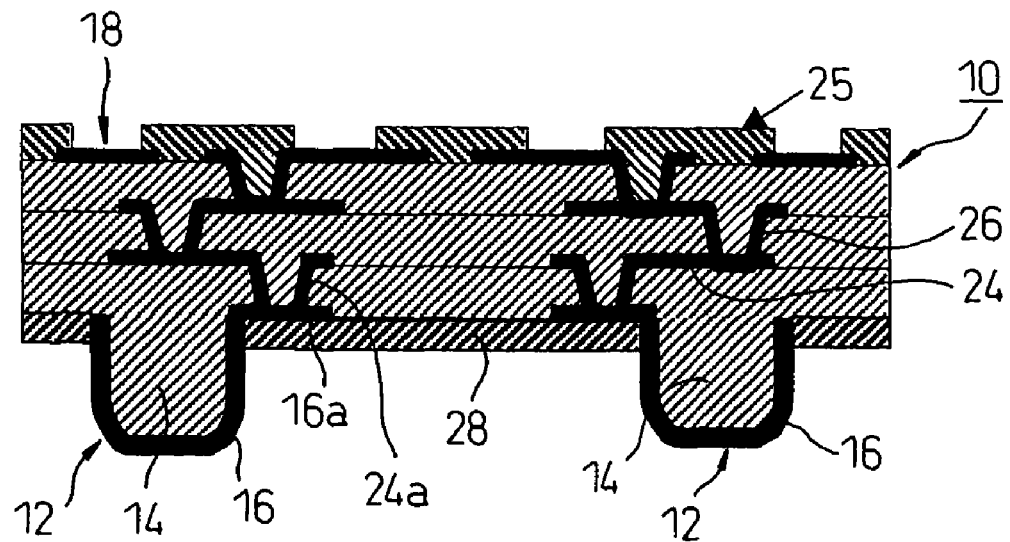

In subsequent steps, as shown in FIG. 32a, an insulating layer to be filled in each recess is formed, followed by forming a predetermined number of insulating layers and wiring layers. Finally, the solder resist layer 25 providing the uppermost layer is formed. As shown in FIG. 32b, the support member 40 is etched off thereby to complete a semiconductor package.

Embodiments of the invention are explained above with reference to the accompanying drawings. This invention is not limited to these embodiments, but can be variously formed, modified or altered without departing from the spirit and scope of the invention.

It will thus be understood from the foregoing description that according to the invention, the external connection terminals for mounting the semiconductor package on other parts or the connection terminals for mounting the semiconductor element on the package have such a structure that bumps filled with the insulating resin and covered with a metal are projected. Thus, the environmental problem can be solved by suppressing the lead consumption at the connecting portions. Also, this bump structure can achieve a fine pitch of the external connection terminals or the semiconductor element connection terminals.

The invention claimed is:

1. A semiconductor package comprising:
    A multilayer wiring substrate formed with a plurality of insulating layers and a plurality of wiring layers alternately stacked each other where a portion of the outermost insulating layer is projected outwardly from the multilayer wiring substrate to form a projected bump;
    a first terminal formed with a metal layer on a first surface of the multilayer wiring substrate where the projected bump is not formed; and
    a second terminal formed with a metal layer that covers substantially the whole surface of the projected bump on a second surface defined by the outermost insulating layer;
    wherein a via hole is provided in the outermost insulating layer where the projected bump is formed extending the via hole to the metal layer of the second terminal; and
    a conductor via is formed within the via hole of the projected bump thereby electrically connecting the metal layer of the second terminal to the metal layer of the first terminal via the plurality of wiring layers;
    wherein the metal layer covering the surface of the projected bump is made of any selected one of the combinations of metals including, from the surface side, Au/Ni/Cu, Au/Pd/Ni/Cu and Au/Pd/Ni/Pd/Cu, thereby Cu of the metal layer is in contact with an insulating surface of projected bump and also is connected with the conductor via formed within the via hole of the projected bump.

2. A semiconductor package as set forth in claim 1, wherein the first terminal is used for mounting a semiconductor element and is formed as a pad, and the second terminal is used for external connection and is formed as the bump projected from the second surface.

3. A semiconductor package as set forth in claim 2, wherein the first surface is covered with a solder resist layer, and at least a part of the pad is exposed from the solder resist layer.

4. A semiconductor package as set forth in claim 2, wherein the second surface is covered with a solder resist layer, and the bump is projected from the solder resist layer.

5. A semiconductor package as set forth in claim 1, wherein the second terminal is used for mounting the semiconductor element and is formed as the bump projected from the second surface, and the first terminal is used for external connection and is formed as a pad.

6. A semiconductor package as set forth in claim 5, wherein the first surface is covered with a solder resist layer, and at least a part of the pad is exposed from the solder resist layer.

7. A semiconductor package as set forth in claim 5, wherein the second surface is covered with a solder resist layer, and the bump is projected from the solder resist layer.

8. A semiconductor device comprising: a semiconductor package as set forth in claim 1, and a semiconductor element being mounted on the first surface of the semiconductor package in such a manner as to be electrically connected to the first terminal.

9. A semiconductor device comprising: a semiconductor package as set forth in claim 1, and a semiconductor element being mounted on the second surface of the semiconductor package in such a manner as to be electrically connected to the second terminal.

* * * * *